United States Patent [19]

Asano et al.

[11] Patent Number: 4,905,036
[45] Date of Patent: Feb. 27, 1990

[54] IMAGE FORMING PROCESS AND SYSTEM, INCLUDING HEATING STEP OR DEVICE FOR INCREASED DENSITY OF IMAGES

[75] Inventors: Yuji Asano; Jun Sakai; Yumio Matsumoto; Osamu Takagi; Akira Sago, all of Nagoya; Kiyoharu Hayakawa, Aichi; Masashi Ueda, Nagoya; Yukichi Sawaki, Gifu; Keiko Suzuki, Okazaki, all of Japan

[73] Assignee: Brother Kogyo Kabushiki Kaisha, Nagoya, Japan

[21] Appl. No.: 112,217

[22] Filed: Oct. 26, 1987

[30] Foreign Application Priority Data

| Oct. 29, 1986 | [JP] | Japan | 61-257469 |
| Mar. 19, 1987 | [JP] | Japan | 62-64946 |
| Apr. 6, 1987 | [JP] | Japan | 62-51960 |
| Apr. 17, 1987 | [JP] | Japan | 62-58986 |
| May 12, 1987 | [JP] | Japan | 62-70457 |
| Jun. 8, 1987 | [JP] | Japan | 62-142561 |

[51] Int. Cl.⁴ .................. G03B 27/32; G03B 27/52
[52] U.S. Cl. ................... 355/27; 355/30; 430/138
[58] Field of Search ............ 355/27, 30; 430/138

[56] References Cited

U.S. PATENT DOCUMENTS

| 3,187,162 | 6/1965 | Hojo et al. | 355/3 FU |
| 4,348,102 | 9/1982 | Sessink | 355/3 FU |
| 4,355,225 | 10/1982 | Marsh | 355/3 Fu |
| 4,367,037 | 1/1983 | Nishikawa | 355/3 FU |
| 4,399,209 | 8/1983 | Sanders et al. | |
| 4,416,966 | 11/1983 | Sanders et al. | |
| 4,440,846 | 4/1984 | Sanders et al. | |
| 4,554,235 | 11/1985 | Adair et al. | 430/211 |
| 4,562,137 | 12/1985 | Sanders . | |
| 4,582,416 | 4/1986 | Karz et al. | 355/3 FU |
| 4,639,405 | 1/1987 | Franke | 355/3 FU |
| 4,701,397 | 10/1987 | Rourke et al. | 430/138 |
| 4,772,532 | 9/1988 | Adair et al. | 430/138 |

FOREIGN PATENT DOCUMENTS 2133899  8/1984  United Kingdom .

Primary Examiner—Monroe H. Hayes
Attorney, Agent, or Firm—Oliff & Berridge

[57] ABSTRACT

A process and system for forming images on a recording sheet, according to source image information as provided on an original, wherein a pressure-sensitive photosensitive sheet is image-wise exposed to a radiation, to form thereon latent images corresponding to the source image information, and a pressure is applied to the image-wise exposed photosensitive sheet, to cause a chemical reaction and thereby develop the latent images into visible images on the recording sheet. The thus pressurized recording sheet is heated so that the chemical reaction is promoted to thereby increase a density of the visible images.

22 Claims, 15 Drawing Sheets

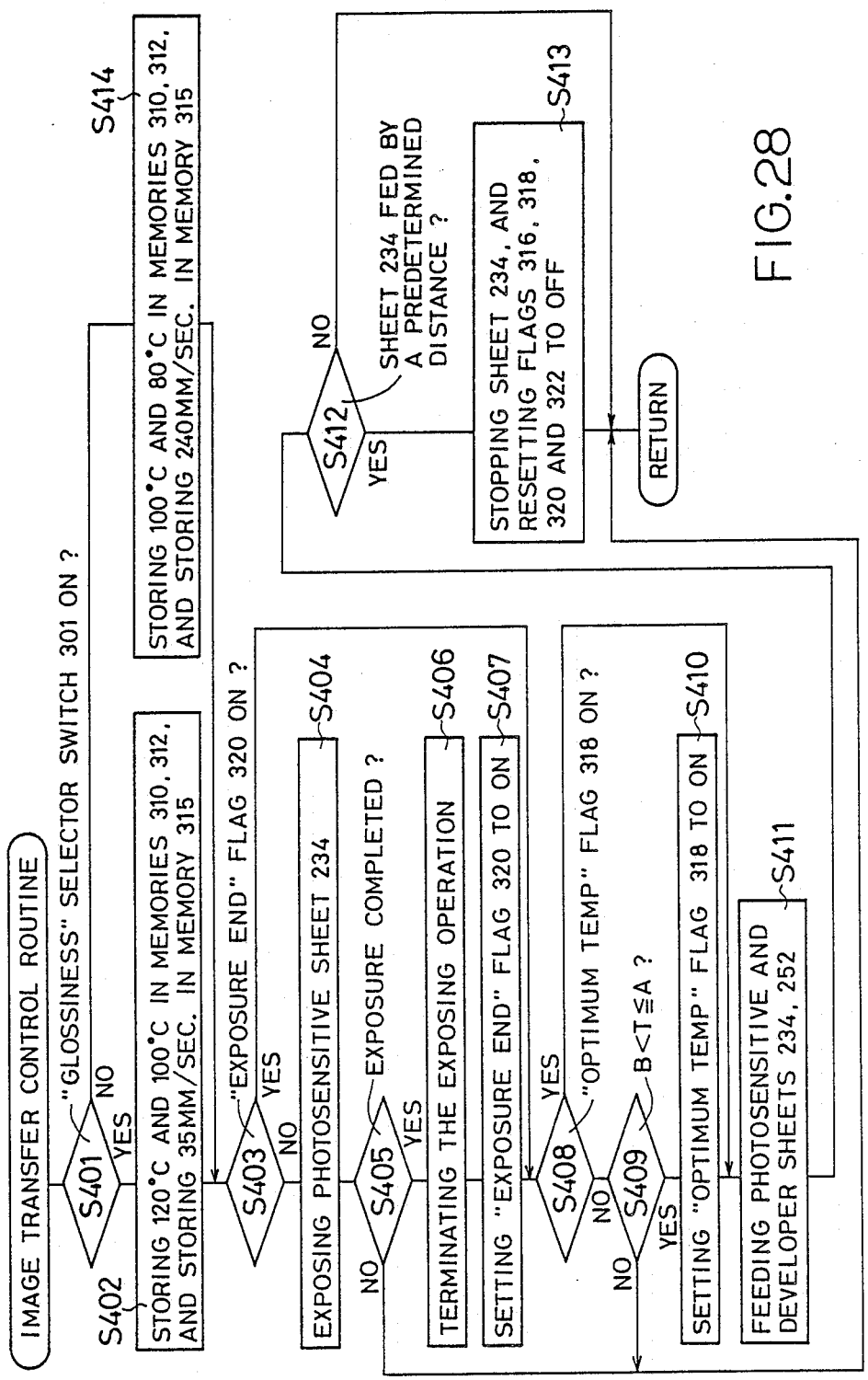

IMAGE FORMING PROCESS AND SYSTEM, INCLUDING HEATING STEP OR DEVICE FOR INCREASED DENSITY OF IMAGES

BACKGROUND OF THE INVENTION

1. Field of the Invention

The present invention relates in general to recording process and system for forming images utilizing a photosensitive sheet, and in particular to techniques for processing the exposed photosensitive sheet or a developer sheet, so that the image-bearing surface of an obtained recording sheet has dense visible images and/or improved glossiness. More particularly, the invention is concerned with such recording or image-forming process and system utilizing a photosensitive sheet which has light- and pressure-sensitive microcapsules.

2. Discussion of the Prior Art

An image transfer process or system which uses a photosensitive sheet having such microcapsules is known in the art. For example, each of the microcapsules forming a photosensitive coating on a substrate of the photosensitive sheet includes a radiation-curable base resin, and a chromogenic material which is supported by the base resin and is capable of reacting with a suitable developing material. The photosensitive coating is image-wise exposed to a radiation from suitable exposing means, according to source image information, so that the microcapsules are cured or left uncured, to form latent images on the exposed photosensitive sheet, according to the image information. In a subsequent developing process, the uncured microcapsules are ruptured by developing rollers, so that the chromogenic material comes out from the ruptured microcapsules, and reacts with the developing material, thereby forming visible images. The developing material is provided either as a developer layer formed on the substrate of the photosensitive sheet, or as a separate developer sheet which is superposed on the photosensitive sheet when the latent images on the photosensitive sheet are developed into the visible images on the developer sheet. In the former case, the photosensitive sheet is used as a recording sheet which is referred to as a self-activated type. In the latter case wherein separate photosensitive and developer sheets are used, the photosensitive sheet is used as an imaging sheet or transfer sheet, while the developer sheet is used as a recording sheet or copy sheet to which desired images are eventually transferred via the imaging sheet. This latter image transfer system is referred to as a separate type.

An example of the self-activated type of photosensitive sheet or photocopy sheet is disclosed in U.S. Pat. No. 4,440,846, and an example of the separate type of image transfer system is disclosed in U.S. Pat. No. 4,399,209.

In both cases indicated above, the image transfer system suffers from a problem which arises from a tendency that a rate of image-wise chemical reaction between the chromogenic material and the developing material is influenced by environmental conditions such as the ambient temperature, and the reaction rate is relatively low. Sometimes, it takes more than 30 minutes after the commencement of the chemical reaction, in order to allow the chemical reaction to continue until the obtained copy sheet is given a satisfactory level of image density.

SUMMARY OF THE INVENTION

It is therefore a principal object of the present invention to provide a recording process which utilizes a pressure-sensitive, photosensitive sheet and which permits a high rate of increase in the density of the recorded images, to a sufficiently high level.

The above object may be achieved according to one aspect of the present invention, which provides a recording process for forming images, comprising image-wise exposing a pressure-sensitive photosensitive sheet or medium to a radiation, so as to form thereon latent images according to source image information, applying a pressure to the image-wise exposed photosensitive sheet, for causing a chemical reaction to thereby develop the latent images into visible images, and heating the developed photosensitive sheet for promoting the chemical reaction to thereby increase a density of the visible images.

In the instant recording process of the invention described above, the pressure application to the exposed pressure-sensitive photosensitive sheet results in developing the latent images on the recording sheet into the visible images, due to a chemical reaction induced by the pressure application. The thus developed photosensitive sheet having the visible images is then subjected to a heat treatment so that the chemical reaction initiated in the developing step is promoted to thereby accelerate a rate of increase in the density of the visible images, and to increase the density level of the finally fixed visible images.

According to one advantageous feature of the invention, the photosensitive sheet is a self-activated type which comprises a substrate, a developer layer of a developing material formed on the substrate, and a multiplicity of microcapsules formed on or embedded in the developer layer. Each of the microcapsules comprises a light-sensitive base resin, and a chromogenic material which is held by the base resin and which is capable of chemically reacting with the developing material of the developer layer. In this case, the photosensitive sheet such as one having radiation-curable microcapsules is image-wise exposed to the radiation, according to the source image information. Namely, the exposed microcapsules are cured or softened or otherwise image-wise exposed so that the exposed photosensitive sheet is given a distribution pattern of rupture strength corresponding to the source image information. In the next pressure application step, the radiation-curable microcapsules in the uncured areas of the photosensitive sheet are comparatively easily ruptured, causing the chromogenic material to flow therefrom and chemically react with the developing material of the developer layer, whereby the visible images appear on the photosensitive sheet. In accordance with the instant feature of the invention, the chromogenic material and the developing material which have commenced the chemical reaction are heated in the following step, so that the chemical reaction is promoted or accelerated. That is, the reaction may occur at a comparatively higher rate, and the density of the visible images may be increased at a comparatively higher rate to a relatively higher level.

The above object of the invention may also be achieved by a process according to another aspect of the invention, which comprises image-wise exposing a pressure-sensitive photosensitive sheet or medium to a radiation, so as to form thereon latent images, according to source image information, superposing the image-wise exposed photosensitive sheet or medium and a separate developer sheet on each other, applying a pressure to the superposed photosensitive and developer sheets, for causing a chemical reaction to thereby develop the latent images on the photosensitive sheet into visible images on the developer sheet, and heating the developer sheet having the visible images, for promoting the chemical reaction to thereby increase a density of the visible images.

In the above recording process, the separate photosensitive and developer sheets are superposed on each other after the photosensitive sheet is image-wise exposed and before the two sheets are developed in the pressure application step. In this case, the developer sheet having the visible images is subjected to the heating step, for the same purpose as described above with respect to the process which uses the self-activated type of photosensitive recording sheet.

According to the process described just above, the photosensitive sheet may comprise a substrate, and a photosensitive layer formed on the substrate and including a multiplicity of microcapsules. Each of the microcapsules comprising a light-sensitive base resin, and a chromogenic material held by the base resin. The developer sheet comprises a substrate, and a developing layer of a developing material supported by the substrate thereof. The developing material is capable of chemically reacting with the chromogenic material of the microcapsules. In this case, too, the heating step permits acceleration of the chemical reaction between the chromogenic material and the developing material.

As described above, either of the above two image transfer processes is effective to promote the chemical reaction which has been initiated by the pressure application step. The promotion of the chemical reaction provides for an increased rate of increase in the image density to a comparatively high level, which results in a reduced time necessary for fixing the visible images and provides enhanced quality of the images.

The advantages discussed above will be understood from the results of experiments illustrated in FIG. 1, which were conducted by the applicants according to the process of the invention, by using a photosensitive sheet having the microcapsules as described above, and a separate developer sheet as also described above. More specifically described, the graph of FIG. 1 shows relationships between a density level of visible images formed on developer sheets, and a time lapse after the developer sheet was subjected to a heating step of the instant process. This heating step was effected after the developer sheet having the visible images was passed through the nip of a pair of presser rolls. Three different conditions were used for these pressing and heating steps. A curve X indicated by one-dot chain line in FIG. 1 shows the relationship where the developer sheet was pressed under 470kg/cm$^2$ at a room temperature of 20° C., and a curve Y indicated by two-dot chain line shows the relationship where the developer sheet was pressed under 600kg/cm$^2$ also at a room temperature of 20° C. A curve Z indicated by solid line shows the relationship where the pressing force was 470kg/cm$^2$ and the heating temperature was 80° C. It will be understood from the graph that a relatively high image density can be obtained in a comparatively shorter length of time after the heating step, where the heating temperature is comparatively high, even though the pressing force applied before the heating step is comparatively small. It is further noted that the obtained saturated image density is considerably higher (curve Z) when the heating temperature is higher (80° C. as compared with 20° C. of curves X and Y). Thus, the instant process permits to reduce the required fixing time for the images formed on a copy recording sheet (i.e., developer sheet or photosensitive sheet which have been pressure-developed and heated), and assures a sufficiently high level of density of the images.

While the recording process according to the present invention is suitably practiced in an image transfer system or copying machine wherein images are transferred from an original to a recording sheet, the principle of the invention can be equally suitably practiced in other image-forming devices such as a printer in which source image information is supplied in the form of electric signals.

It is another principal object of the invention to provide a recording system suitable for practicing the process of the invention.

This object may be attained according to another aspect of the invention, which provides a recording system for forming images on a recording sheet, comprising an exposing device, a developing device and a heating device. The exposing device is adapted to image-wise expose a pressure-sensitive photosensitive sheet to a radiation, so as to form thereon latent images, according to source image information. The developing device applies a pressure to the image-wise exposed photosensitive sheet, for causing a chemical reaction to thereby develop the latent images into visible images on the recording sheet. The heating device is operable to heat the recording sheet for promoting the chemical reaction to thereby increase the density of the visible images. Since the instant system has the heating device for effecting the heating step of the process described above, the system provides the same advantages discussed above.

As apparent from the foregoing description, the finally obtained recording sheet consists of either a photosensitive sheet per se or a separate developer sheet, which has been subjected to the developing step effected by the developing device to develop the latent images into the visible images. In either case, the recording sheet provided with the visible images is heated by the heating device.

It is further noted that the heating of the developed photosensitive sheet or developer sheet according to the present invention is also effective to more or less improve the glossiness of the transferred images on the recording sheet. To obtain a sufficiently high level of glossiness of the images (e.g., about 90% relative specular glossiness), it is generally necessary to heat the photosensitive sheet or developer sheet at a relatively high temperature (e.g., 200° C.) for a relatively long time (e.g., 30 seconds). This heating condition requires a large energy consumption, and a long time before the desired heating temperature is reached, and tends to cause smokes and odors due to vaporization of the chromogenic and developing materials, for example. Further, the above heating condition causes an increase in the operating temperature of the image transfer system as a whole.

In view of the above, it is another object of the present invention to provide the recording system described above, with suitable means for improving the glossiness of the images formed on the recording sheet, without elevating the heating temperature to an extent more than necessary to obtain the desired image density.

The above object may be achieved according to one feature of the recording system of the present invention, wherein the heating device comprises a pair of presser members operable to press the recording sheet therebetween. One of the presser members has a smooth surface adapted to contact an image-bearing surface of the copy sheet. The image-bearing surface of the recording sheet can be smoothed and glossed when the copy sheet is passed through the nip of the presser members, with the image-bearing surface kept in pressed contact with the smooth surface of the above-indicated one presser member.

In the image transfer system according to the above feature of the invention, the recording sheet is concurrently pressed and heated by the heating device, such that the image-bearing surface of the recording sheet is in pressed contact with the smooth surface of the presser member. As a result, the pressed image-bearing surface is smoothed following the smooth surface of the presser member, and the images on the copy sheet can be considerably glossed. Thus, the heating device permits a high level of relative specular glossiness of the images, as well as a high level of the image density, without requiring a high heating temperature which leads to increased energy consumption, generation of smokes and odors, and elevated temperature of the system. Further, the instant arrangement permits the recording sheet to be heated to the desired temperature in a shorter period of time.

According to one form of the above feature of the invention, the above-indicated one of the pair of presser members having the smooth surface includes a heating member.

According to an alternative form of the same feature of the invention, the other presser member has a surface for contact with a surface of the recording sheet opposite to the image-bearing surface, and the above-indicated other presser member includes a heating member. In this case, the image-bearing surface of the copy sheet is not in direct contact with the heated presser member. This arrangement is desirable, since the image-bearing surface is heated relatively slowly, and this slow heating avoids otherwise possible foaming of the composition of the recording sheet.

The heating device of the instant recording system must be controlled so that the heating temperature is maintained within a permissible range for obtaining a desired result of promoting or accelerating the chemical reaction to increase the image density of the recording sheet. This permissible range is relatively narrow, and therefore the heating temperature of the heating device must be precisely controlled. However, it is difficult to control the heat-generating source of the heating device such that the temperature of the heated recording sheet is maintained with the relatively narrow permissible range indicated above.

Therefore, it is a further object of the present invention to provide the instant recording system, with suitable means for facilitating the control of the heating device.

This object may be achieved according to another feature of the recording system of the invention, wherein the heating device includes a heat-generating source, and a heat-conductive member for conducting heat generated by the heat-generating source to the recording sheet. The heat-conductive member includes a non-metallic layer. A temperature sensor is disposed on one of opposite sides of the non-metallic layer of the heat-conductive member, which is nearer to the heat-generating source. To control the heat-generating source, a control circuit is connected to the temperature sensor and the heat-generating source, so that an amount of heat generated by the source is regulated according to an output signal of the temperature sensor.

In the recording system constructed according to the above feature of the invention, the heat-generating source is electrically controlled by the control circuit, which is operated in response to the output signal from the temperature sensor, so that the amount of heat generated by the source is held within a range which corresponds to an optimum range of temperature of the image-bearing recording sheet suitable for fixing the visible images on the recording sheet. Further, the heat generated by the heat-generating source is conducted to the recording sheet via the non-metallic layer having a relatively low thermal conductivity. Consequently, the rate of change of the temperature of the image-bearing surface of the recording sheet is made lower than that of the heat-generating source.

According to the above arrangement wherein the recording sheet is heated via the non-metallic layer of the heat-conductive member of the heating device, the temperature of the image-bearing surface of the recording sheet can be maintained within the optimum range, with a comparatively wider permissible range of variation or fluctuation of the temperature of the heat-generating source, than that in the case where no non-metallic layer is used. Accordingly, the required detecting accuracy of the temperature sensor, and the required operating accuracy of the control circuit may be lowered. This means a reduced cost of the equipment for controlling the temperature of the recording sheet heated by the heating device.

For the same reason, the required frequency of controlling the voltage or current to be applied to the heat-generating source can be reduced. In particular, where the heat-generating source is a filament lamp which is energized and deenergized to control the heating temperature, the reduction in the on-off frequency of the lamp leads to increased life expectancy of the lamp.

Furthermore, since the temperature on the side of the non-metallic layer nearer to the heat-generating source is detected by the temperature sensor and fed back to the control circuit, the temperature regulation of the recording sheet can be facilitated even though the variation of the temperature of the recording sheet is delayed with respect to the variation of the temperature of the heat-generating source.

According to one preferred form of the above feature of the invention, the recording system further comprises a feeding device for feeding the recording sheet, and the non-metallic layer of the heat-conductive member comprises a synthetic resin belt which is moved in the same direction and at the same rate as the recording sheet when the recording sheet is moved by the feeding device. In this case, the recording sheet is heated by the non-metallic layer which is being heated by the heat-generating source toward a predetermined target temperature level after the corresponding portions of the recording sheet and the synthetic resin belt have reached the heated heat-conductive member. Hence, the temperature of the recording sheet is raised at a comparatively lower rate, whereby deterioration of the image-bearing surface of the recording sheet which would occur if its temperature is rapidly raised can be avoided. Moreover, the sensitivity or response of the image-bearing surface to the variation of the temperature of the heat-generating source can be adjusted by changing the feed rate of the recording sheet or belt, depending upon varying operating conditions.

It is noted that a rapid heating of the recording sheet to a high temperature at which the recording sheet is given a sufficiently high level of glossiness will cause the recording sheet to suffer from bubbles or surface roughening defects. Although this undesirable phenomenon can be overcome by heating the recording sheet at a comparatively low temperature for a longer period of time, this leads to increased heat-treatment time and reduced operating efficiency of the recording system.

It is therefore a still further object of the present invention to provide the instant recording system with means for protecting the recording sheet from being deteriorated during the heating step.

The above object can be attained according to a further feature of the recording system of the invention, wherein a feeding device is provided to feed the recording sheet, and the heating device has an inlet portion and an outlet portion which are disposed such that the recording sheet is fed in a direction from the inlet portion toward the outlet portion. The heating device is adapted such that the inlet portion has a lower operating temperature than that of the outlet portion. In this arrangement, the recording sheet is first heated by the inlet portion of the heating device to a comparatively low temperature, before the recording sheet is heated by the outlet portion of the heating device to a predetermined higher temperature at which the recording sheet can be sufficiently glossed. Thus, the recording sheet is prevented from being heated rapidly to the final heating temperature, and therefore protected from otherwise possible bubbling or other deterioration of the image-bearing surface. Accordingly, the instant heating device assures the image-bearing surface to have enhanced smoothness and glossiness, i.e., high quality images on the recording sheet. Further, since the recording sheet is adapted to pass the inlet portion as a low-temperature pre-heating stage, and the outlet portion as a high-temperature preliminary heating stage, the overall heating time can be reduced, as compared with that of an heating arrangement wherein the recording sheet is maintained at a relatively low temperature for a long time.

According to one preferred form of the above feature of the invention, the heating device has a heating surface for facial contact with the recording sheet, and the heating device is controlled such that the heating surface has a lower temperature at the inlet portion than at the outlet portion.

According to an alternative form of the same feature of the invention, the heating device comprises a plurality of heating rolls. The heating rolls are disposed such that their rotating axes are perpendicular to the feeding direction of the recording sheet, and are spaced apart from each other in the feeding direction. The heating rolls are adapted to have temperatures which increase in the feeding direction from the inlet portion toward the outlet portion.

In the case where the source image information to be recorded on the recording sheet is provided as images on an image-bearing surface of an original, it is desirable that the glossiness of the images formed on the recording sheet corresponds to a glossiness of the images on the specific original.

In view of the above desirability, it is a yet further object of the invention to provide the instant recording system with means for the giving the recording sheet a glossiness which corresponds to the glossiness of the original from which images are transferred to the recording sheet.

The above object may be achieved according to a still further feature of the present invention, wherein the source image information is provided on an original having an image-bearing surface, and the exposing device includes an image-illuminating device operable to produce the radiation to illuminate the image-bearing surface of the original. The recording system according to this feature of the invention includes a feeding device for feeding the recording sheet, a detector for sensing a glossiness level of the image-bearing surface of the original, and a control device responsive to the glossiness detector. The control device is adapted to control a heating temperature of the heating device and/or a rate of feeding of the recording sheet by the feeding device, so as to give the heated recording sheet a glossiness which corresponds to the glossiness of the original sensed by the glossiness detector.

In the recording system, i.e., image transfer system constructed as described above, the amount of heat transferred from the heating device to the recording sheet can be changed by changing the heating temperature and/or the feed rate of the recording sheet, depending upon the detected glossiness of the original. Accordingly, the glossiness given to the image-bearing surface of the recording sheet can be adjusted in accordance with the detected glossiness of the image-bearing surface of the original. In other words, the glossiness of the original can be reproduced on the image-bearing surface of the recording sheet, by controlling at least one of the heating temperature and the sheet feeding speed based on the output of the glossiness detector.

In some cases, it is desirable that the glossiness to be given on the recording sheet be different from that of the original, or be selected irrespective of the glossiness of the original. Further, where the source image information is provided as electric signals representative of desired images to be printed on the recording sheet, it is preferred that the glossiness to be given on the recording sheet may be adjusted as needed.

Therefore, it is still another object of the present invention to provide the instant recording system with means for adjusting the glossiness to be given on the recording sheet.

The above object may be attained according to a yet further feature of the invention, wherein a feeding device is provided for feeding the recording sheet, and a control device is provided to control at least one of a heating temperature of the heating device and a rate of feeding of the recording sheet by the feeding device, such that a glossiness of the recording sheet coincides with one of a plurality of predetermined different levels which is selected by the operator or designated by an input signal to the recording system.

In the recording system constructed as described above, the glossiness to be given on the recording sheet can be changed by controlling the heating temperature and/or the feed rate of the recording sheet. Namely, the desired glossiness of the recording sheet can be selected from among the plurality of different glossiness levels, and the selected glossiness can be provided by regulating at least one of the heating temperature and the feed rate of the recording sheet.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which:

FIGS. 27 and 28 are flow charts illustrating control programs of the embodiment of FIG. 26, corresponding to that of FIGS. 23 and 25, respectively.

DETAILED DESCRIPTION OF THE PREFERRED EMBODIMENTS

Referring first to FIGS. 2, 3, 4, 5, 6(a) and 6(b), there is shown the first embodiment of the image transfer system of the present invention.

Figure 1:
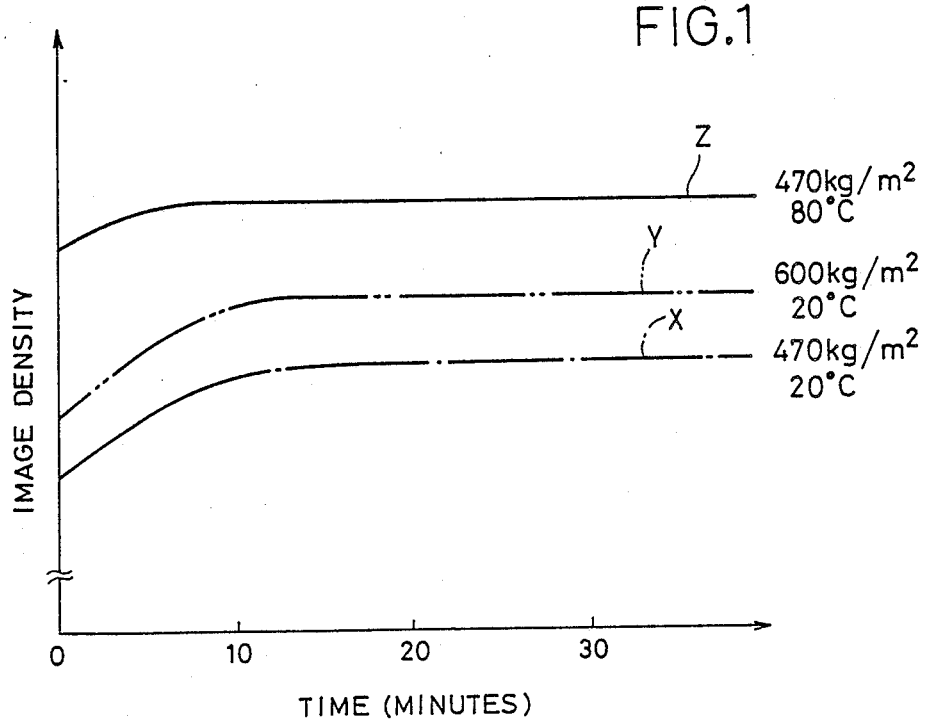
FIG. 1 is a graph showing relationships between a density of visible images formed on a developer sheet, and a time lapse after the developer sheet is subjected to a heating step of a process according to the present invention.
Figure 2:
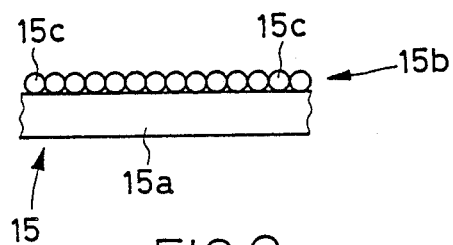
FIG. 2 is a fragmentary elevational view of a photosensitive sheet used according an image transfer process according to one aspect of the invention.
Figure 3:
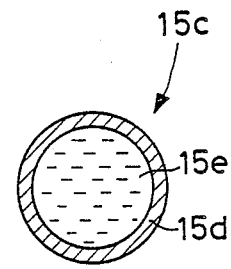
FIG. 3 is a view illustrating a microcapsule structure of the photosensitive sheet of FIG. 2.

The present image transfer system uses a pressure-sensitive, photosensitive sheet 15 as disclosed in U.S. Pat. No. 4,399,209, the disclosure of which is hereby incorporated by reference. The photosensitive sheet 15 is radiation-curable and pressure-sensitive. Briefly, the sheet 15 consists of a substrate 15a, and a photosensitive layer 15b formed on the substrate 15a, as shown in FIG. 2. The photosensitive layer 15b contains a multiplicity of microcapsules 15c. Each microcapsule includes an outer covering 15d, and an inner mass 15e which contains a radiation-curable base resin and a chromogenic material encapsulated within the outer covering 15d; as depicted in FIG. 3.

Figure 4:
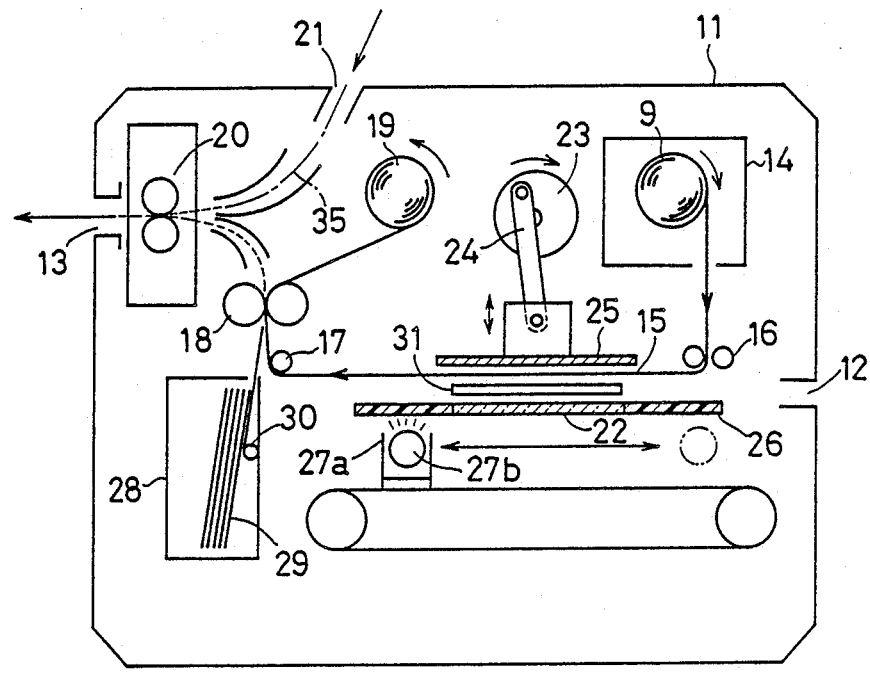
FIG. 4 is an elevational view partly in cross section of one embodiment of an image transfer system of the present invention, which uses the photosensitive sheet of FIG. 2.

FIG. 4 shows the entire arrangement of the image transfer system. In the figure, reference numeral 11 designates a housing having an inlet 12 through which an original 31 (which will be described) is inserted, and an outlet 13 through which a copy sheet (i.e., processed developer sheet which will be described) is ejected. The housing 11 accommodates various components, in the order of arrangement from right to left as seen in FIG. 4.

The above-indicated photosensitive sheet 15 is provided in the form of a photosensitive web 9 accommodated in a cassette 14. Under the cassette 14, there are disposed a pair of feed rollers 16 for feeding the photosensitive web 9. The web 9 is fed along a path which is defined by a guide roller 17 located to the left of the feed rollers 16, a pair of squeezing or developing rollers 18 located above the guide roller 17, and a take-up roller 19 located above and to the right of the developing rollers 18. Located above and to the left of the developing rollers 18, there is provided a heating device in the form of a calendering device 20.

Above a portion of the path of the photosensitive web 9 between the feed rollers 16 and the guide roller 17, namely, above the photosensitive sheet 15, there is disposed a holder mechanism adapted to hold the original 31 and the photosensitive sheet 15 in sliding contact with each other, between the holder mechanism and a glass plate 22 of a support member 26 located below the path of the web 9. The holder mechanism includes a driven gear 23, a connecting rod 24 connected at its end to the driven gear 23, and a contactor plate 25 located above the path of the web 9. The support member 26 including the glass plate 22 is adapted to support the original 31 in fixed contact with the glass plate 22. Beneath the support member 26 is an image-illuminating device including a light source unit 27a which incorporates a light source 27b capable of producing a radiation. The light source unit 27a is movable in a horizontal direction parallel to the support member 26.

Beneath and to the left of the guide roller 17, there is disposed a cassette 28 in which developer sheets 29 are accommodated. This cassette 28 is equipped with a feed roller 30 for feeding the developer sheets 29 one at a time toward the developing rollers 18.

Figure 5:
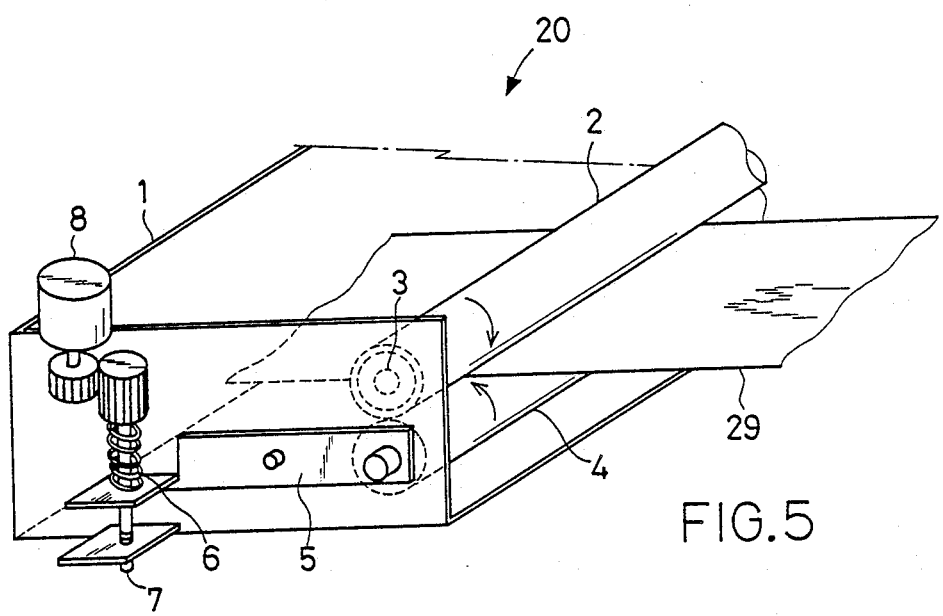
FIG. 5 is a perspective view of a calendering device incorporated in the image transfer system of FIG. 4.

Referring to FIG. 5, the calendering device 20 will be described. The device 20 has a frame 1 which rotatably supports a heating member in the form of a roll 2. This heating roll 2 is rotated in the clockwise direction as seen in the figure, by a suitable drive motor (not shown).

The heating roll 2 has a tetrafluoroethylene ("Teflon") coating on its circumferential surface, so that the coated surface has a surface smoothness of 0.1μRa or higher.

The heating roll 2 consists of a hollow cylinder, in which a sheath heater 3 is suspended such that the heater 3 is spaced apart from the cylindrical wall of the cylinder. Heat generated by the energized heater 3 is transferred to the hollow cylinder of the roll 2 by radiation, whereby the heating roll 2 is heated. Beneath the heating roller 2, there is disposed a platen roll 4 whose circumferential surface is coated with a silicone rubber. This platen roll 4 is rotatably supported by a pair of levers 5 which are pivotally connected, at their longitudinally middle point, to the frame 1. The lever is adapted to support the platen roll 4 at its one end, and is biased by a pressurizing spring 6 such that the platen roll 4 is normally held in pressed contact with the heating roll 2.

The effective length of the pressurizing spring 6 can be varied by rotating an adjusting screw 7, so that the biasing force of the spring 6 and consequently the squeezing pressure at the nip of the two rolls 2, 4 can be adjusted. The adjusting screw 7 has a gear which is rotatable by a motor 8.

The operation of the image transfer system constructed as described above will next be described, again referring to FIGS. 4 and 5.

Initially, the original 31 having source image information on its image-bearing surface is loaded through the inlet 12 into the image transfer system, and placed in position as shown in FIG. 4. Then, the gear 23 of the holder mechanism is driven to lower the contactor plate 25 until the original 31, the photosensitive paper 15 and the glass plate 22 are brought into close contact with each other. Subsequently, the light source unit 27a is moved in the right direction, with the light source 27b being energized, so that the photosensitive sheet 15 having radiation-curable microcapsules 15c is imagewise exposed to the radiation transmitted through the glass plate 22 and the original 31. Thus, the photosensitive sheet 15 is provided with latent images corresponding to the images on the original 31. When the light source unit 27a reaches the predetermined rightmost position, the light source 27b is turned off and the unit 27a is returned to the leftmost original or start position.

It follows from the above explanation that the holder mechanism, support member 26 and image-illuminating device cooperate with each other to constitute an exposing device for image-wise exposing the photosensitive sheet 15 to a radition, so as to form latent images on the exposed sheet 15, according to the images on the image-bearing surface of the original 31. Described in more detail, the radiation-curable base resin 15d of the microcapsules 15c in the exposed areas of the photosensitive sheet 15 is cured and hardened, while the base resin of the microcapsules 15c in the unexposed areas is left uncured.

After the exposing step is completed, the contactor plate 25 is elevated away from the photosensitive sheet 15, and the web 9 is fed by the feed rollers 16 and the take-up roller 19, by a predetermined distance.

When the leading end of the exposed photosensitive sheet 15 almost reaches the developing rollers 18 via the guide roller 17, the developer sheet 29 is fed from the cassette 28 such that the exposed sheet 15 and the developer sheet 29 are superposed on each other when the exposed sheet 15 and the sheet 29 pass through the nip of the developing rollers 18. Due to the pressure applied to the photosensitive sheet 15, the microcapsules 15c in the uncured areas of the photosensitive sheet 15 are ruptured, and the chromogenic material comes out from the ruptured base resin. As a result, the chromogenic material reacts with a developing material of the developer sheet 29, whereby the latent images on the photosensitive sheet 15 are developed into visible images formed on the developer sheet 29. The photosensitive sheet 15 is separated from the developer sheet 29 and re-wound on the take-up roller 19. Then, the developer sheet 29 as a copy or recording sheet having the visible images enters the calendering device 20, and passes through the nip between the pair of presser rolls in the form of the heating and platen rolls 2, 4. The heating of the recording sheet 29 promotes the image-forming chemical reaction between the developing material and the chromogenic material, whereby the rate of increase in the density of the images formed on the recording sheet 29 is increased. Further, the finally saturated level of the image density is increased. The thus processed recording sheet 29 is ejected through the outlet 13.

The housing 11 of the image transfer system further has an inlet opening 21 through which a suitable protective or covering sheet is inserted, if desired, so that the protective or covering sheet 35 is bonded to the recording sheet 35 by a thermally fusible adhesive while the sheets pass through the nip of the rolls 2, 4.

Figure 6A:
FIG. 6(a) and 6(b) are views illustrating surface conditions of a developer sheet used in the image transfer system of FIG. 4.
Figure 6B:

The operation of the calendering device 20 will then be described in detail, by reference to FIGS. 5, 6(a) and 6(b). The developer sheet 29 enters the nip of the rolls 2, 4 such that the image-bearing surface faces up, namely, so that the image-bearing surface contacts the heating roll 2. The heat roll 2 having the smooth coated surface as described above is heated to a temperature within a range between 100° C. and 200° C. The image-bearing surface is smoothed and glossed by means of both heat and pressure. Described more specifically, the image-bearing surface of the developer sheet 29 before entering the calendering device 20 is considerably rough as indicated in FIG. 6(a). Due to the heat applied to the image-bearing surface, the viscosity of the chromogenic material and the developing material on the developer sheet 29, and the elasticity of the substrate of the sheet 29 are reduced. Since the image-bearing surface in this condition is pressed by the smoothly finished surface of the rolls 2, 4, the image-bearing surface of the resulting recording sheet 29 is smoothed as indicated in FIG. 6(b), whereby the glossiness of the surface is enhanced. The image-bearing surface may be given a relative specular glossiness of about 90% (that of an ordinary glossy photograph), if the developer sheet or recording sheet 29 is kept under a pressure of 2–3Kg/cm$^2$ at a temperature of about 100° C. as measured on the image-bearing surface.

It is to be understood that the developer sheet 29 which has passed the developing rollers 18 is referred to as the recording sheet. The source image information on the original 31 is eventually transferred to the recording sheet, via the photosensitive sheet 15 and the developer sheet 29.

Figure 7:
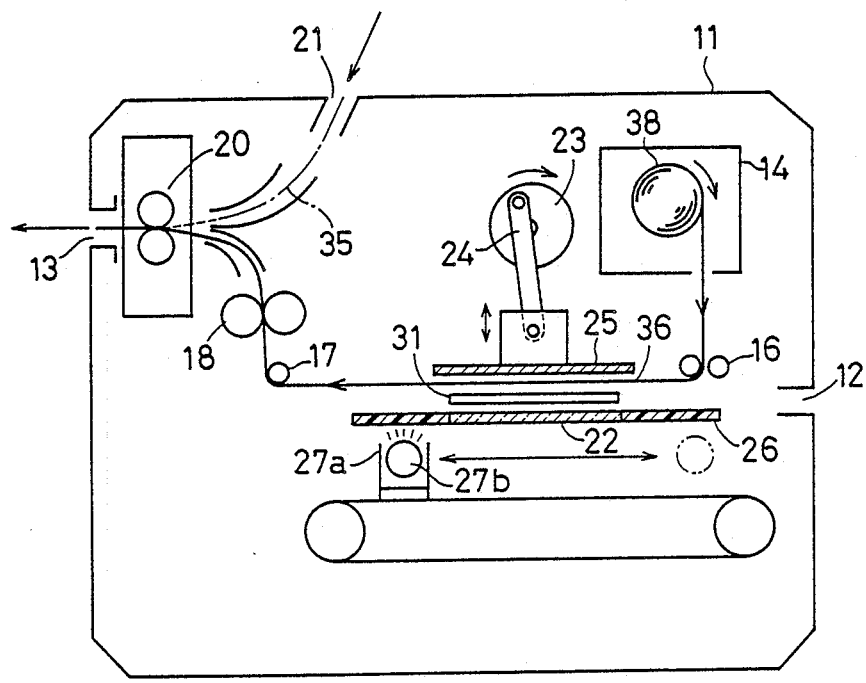
FIG. 7 is an elevational view of another embodiment of the image transfer system of the invention, corresponding to that of FIG. 4.
Figure 8:
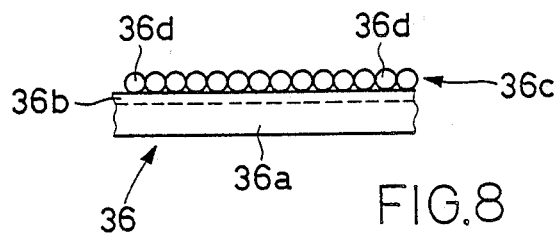
FIG. 8 is a fragmentary elevational view of a self-activated type of photosensitive sheet used in the embodiment of FIG. 7.

Referring to FIG. 7, there is shown another embodiment of an image transfer system which uses a photosensitive sheet 36 of a self-activated type as shown in FIG. 8. This type of photosensitive sheet is disclosed in U.S. Pat. No. 4,399,209, the disclosure of which is hereby incorporated by reference. Unlike the photosensitive sheet 15 used in the preceding embodiment, the photosensitive sheet 36 includes a developer layer 36b formed between a substrate 36a and a photosensitive layer 36c. Like the photosensitive sheet 15b of the photosensitive sheet 15, the photosensitive layer 36c includes a multiplicity of microcapsules 36d. Each microcapsule 36d includes a chromogenic material encapsulated within a radiation-curable base resin, as shown in FIG. 3. The developer layer 36b is formed of a developing material which is capable of reacting with the chromogenic material of the microcapsules 36d.

In the image transfer system of FIG. 7, the photosensitive sheet 36 which has been image-wise exposed to a radiation from the light-source unit 27a is passed through the nip of the developing rollers 18, without a developer sheet. During this developing process, the uncured microcapsules 36d are ruptured, and the chromogenic material flowing from the ruptured microcapsules 36d reacts with the developing material of the developer layer 36b. In this sense, the photosensitive sheet 36 is referred to as a self-activated type. The thus developed photosensitive sheet 36 is fed to the calendering device 20.

Since a separate developer sheet is not used in combination with a photosensitive transfer sheet, the instant image transfer system requires neither a cassette and a feed roller for feeding the developer sheet to the developing device 18, nor a take-up roller for rewinding the developed photosensitive sheet 36.

Figure 9:
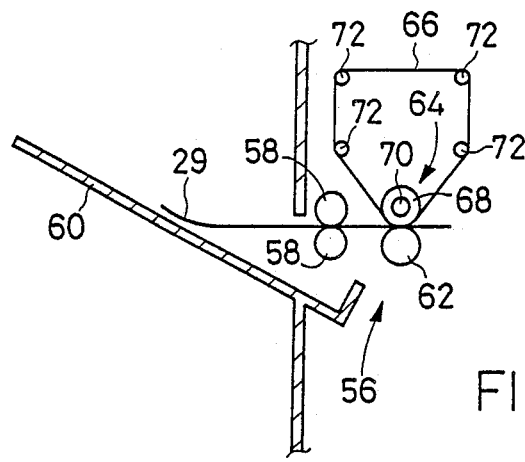
FIG. 9 is a fragmentary elevational view of a further embodiment of the image transfer system of the invention.

Referring to FIG. 9, there is shown a further embodiment of the invention, which uses a modified calendering or heating device 56 which is substituted for the calendering device 20 of FIG. 5 used in the preceding embodiments of FIGS. 4 and 7. In this embodiment, the developer sheet 29 as used in the embodiment of FIG. 4 is used in combination of the photosensitive sheet 15 (not shown in FIG. 9).

The heating device 56 is disposed downstream of a suitable developing device (such as the developing rollers 18 used in the preceding embodiments), and is capable of heating the developer sheet 29 at a temperature within a controlled range. The heated developer sheet 29 is ejected by a pair of ejector rollers 58 onto an outlet tray 60 provided on the outlet side of the system.

The construction of the heating device 56 will be described in detail.

The heating device 56 includes a first roll 62 and a second roll 64 which are disposed so as to extend perpendicularly to the feeding direction of the developer sheet 29. The first and second rolls 62, 64 are adapted to press the developer sheet 29 therebetween, such that the first roll 62 contacts the image-bearing surface (lower surface as seen in FIG. 9) while the second roll 62 contacts the opposite or upper surface. Described more precisely, the second roll 64 contacts the upper or non-imaged surface of the developer sheet 29, via a thin endless belt 66 made of a material having a relatively low thermal conductivity, such as a synthetic resin.

The first and second rolls 62, 64 are biased toward each other by a small force, and the second roll 64 is positively driven by a suitable drive. On the other hand, the first roll 62 is freely rotatably supported. Thus, the first and second rolls 62, 64 are adapted to feed the developer sheet 29 in pressed contact therewith in the feeding direction, such that the two rolls 62, 64 are rotated at the same speed.

The second roll 64 includes a hollow metallic cylinder 68, and a heat-generating source in the form of a halogen lamp 70 accommodated within the cylinder 68. The halogen lamp 70 is energized to generate heat according to a voltage applied from a suitable power supply (not shown). The heat generated by the halogen lamp 70 is conducted through the cylinder 68 and the endless belt 66 indicated above, to the developer sheet 29. In the present embodiment, the cylinder 68 and the endless belt 66 constitute a heat-conductive member.

The halogen lamp 70 has an operating characteristic that its temperature rises to its maximum level, following a predetermined curve of transition temperatures, as the time elapses after the energization by applying a predetermined voltage. In the present embodiment, the desired or target temperature of the halogen lamp 70 is set within the transition range, in order to reduce the rise time in an initial period following the commencement of energization. For this reason, it is necessary to adjust the temperature of the lamp 70, by regulating the voltage applied thereto. To this end, the halogen lamp 70 is provided with a temperature sensor (not shown), so that the power supply is controlled according to an output signal from the temperature sensor, in order to regulate the voltage to be applied to the lamp 70 so as to maintain the temperature of the lamp 70 within a predetermined desired range. In this case, the power supply device incorporates a control circuit for controlling the voltage to be applied to the lamp 70.

The endless belt 66 is guided by the second roll 64, and four guide rollers 72 whose axes are perpendicular to the feeding direction of the developer sheet 29. The guide rollers 72 are supported freely rotatably about their axes. As the second roll 64 is driven in the clockwise direction (in FIG. 9), the endless belt 66 is rotated in the same direction. Thus, the second roll 64 and the four guide rollers 72 provide a device for feeding the developer sheet 29, in cooperation with the drive source to drive the second roll 64. It is noted that the endless belt 66 is capable of efficiently radiating the heat transferred thereto, as the belt having a relatively wide surface area is circulated along a closed path.

According to the arrangement described above, a portion of the developer sheet 29 nipped between the first and second rolls 62, 64 is heated indirectly by the cylinder 68, via the corresponding portion of the endless belt 66. In other words, the developer sheet 29 is heated slowly in direct contact with a portion of the endless belt 66 which is in the process of being heated, whereby the temperature of the image-bearing surface of the developer sheet 29 is elevated at a low rate. As the heated portions of the developer sheet 29 and belt 66 leave the rolls 62, 64, these portions are cooled to lower temperatures.

Figure 10:
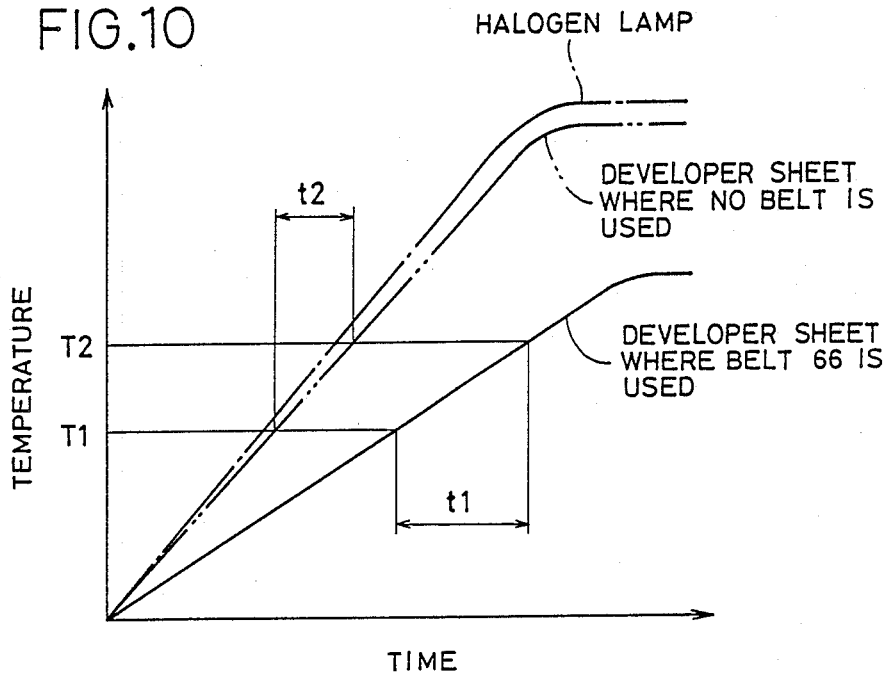
FIG. 10 is a graph showing changes in the temperatures of a halogen lamp and a developer sheet which are used in the system of FIG. 9, where the lamp is kept energized while the developer sheet is maintained in the same position relative to the lamp.

There will be described in detail a relationship between the temperature rise of the halogen lamp 70 and that of the developer sheet 29. Assuming that the halogen lamp 70 is turned on when corresponding portions of the developer sheet 29 and belt 66 are held in contact with the cylinder 68. In this case, the temperature of the halogen lamp 70 rises to its maximum saturated level, via a transition range in which the temperature rises with time, as shown in FIG. 10. On the other hand, the temperature of the developer sheet 29 heated via the belt 66 rises up to the saturated level, at a lower rate than that of the lamp 70. It is apparent from FIG. 10 that a time span t1 during which the developer sheet 29 heated via the belt 66 is maintained within a desired temperature range T1-T2 is larger than a time span t2 during which the developer sheet 29 heated directly by the second roll 64 is maintained within the desired temperature range T1-T2.

Figure 11:
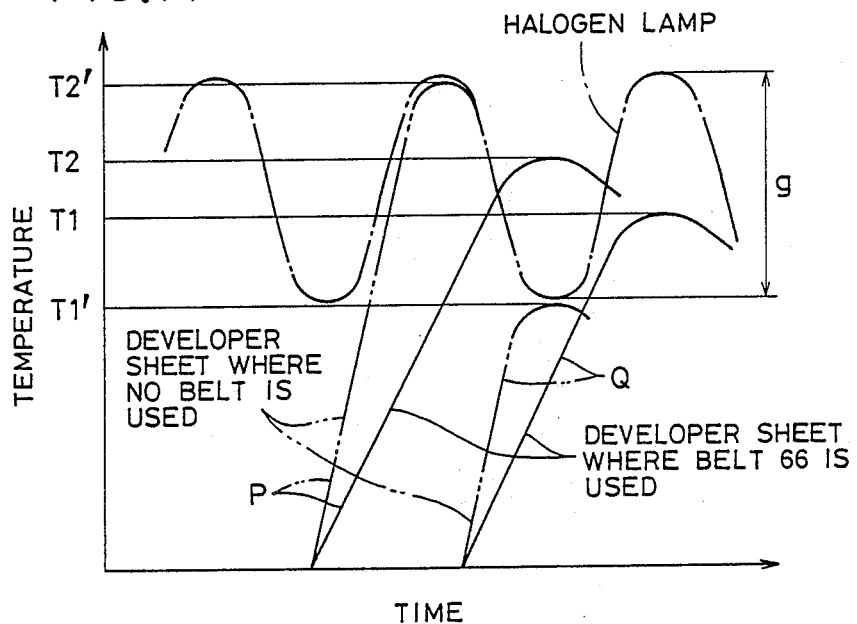
FIG. 11 is a graph showing a change in the temperature of the lamp of FIG. 10, and changes in the temperatures of the developer sheet at different points P and Q.

Referring to FIG. 11, there are illustrated heating operations of certain portions of the developer sheet 29 which are initiated at different points P and Q, while the temperature of the halogen lamp 70 is fluctuated within a range indicated at g. Certainly, the time span during which the specific portions of the developer sheet 29 and belt 66 are held in indirect and direct contact with the heated metallic cylinder 68 is a considerably limited time. Solid lines represent temperature-time curves of the developer sheet 29 heated via the endless belt 66 according to the invention, while two-dot chain lines represent those of the developer sheet 29 directly heated by the heated cylinder 68. As shown in the figure, the temperature rise of the specific portion of the sheet 29 is commenced when that portion approaches the heated cylinder 68. The temperature rise continues until the peak level is reached. As the heated portion of the sheet 29 leaves the cylinder 68, the temperature is lowered. However, the peak level is not the same for all portions of the sheet 29. In other words, the peak temperature of the developer sheet 29 heated via the belt 66 varies within a range of T1-T2, depending upon the temperature of the halogen lamp 70 at the time the specific portions of the sheet 29 are heated. Since the temperature of the developer sheet 29 heated via the belt 66 is changed at a lower rate than that of the halogen lamp 70, the fluctuation width T1-T2 of the peak temperature of the developer sheet 29 heated according to the invention is considerably smaller than a fluctuation width T1'-T2' of the developer sheet where the sheet is directly heated by the heated cylinder 68, without the use of an endless belt therebetween. In the latter case indicated by two-dot chain lines, the temperature of the developer sheet 29 is highly responsive to the varying temperature of the halogen lamp 70, and the peak temperature of the sheet 29 is fluctuation within a comparatively wide range, i.e., between T1' and T2'. It will therefore be understood that the present embodiment permits the temperature of the halogen lamp 70 to be fluctuated over a comparatively wide range, while maintaining a relatively small amount of variation of the peak temperature of the heated developer sheet 29. Thus, the instant arrangement facilitates controlling the heating device 56. It is noted that the peak temperature of the developer sheet 29 may exceed the temperature of the halogen lamp 70, due to a delayed heat conduction through the belt 66.

While the metallic cylinder 68 and the endless belt 66 are used as a heat-conductive member and a non-metallic layer, respectively, it is possible that a synthetic resin coating is applied to the circumferential surface of the cylinder 68, so that the resin coating is used as the non-metallic layer in place of the belt 66. In this case, the resin coating is given a relatively large thickness or formed of a material having a relatively low thermal conductivity, so that the heat transfer from the halogen lamp 70 to the developer sheet 29 is sufficiently restrained, in order to reduce an amount of temperature fluctuation of the developer sheet 29, as compared with that of the heat source 70.

It is further possible that the heat-conductive member consists of a first cylinder incorporating a heat-generating source in its bore, and a second cylinder which is disposed radially outwardly of the first cylinder such that an annular space exists between the two cylinders. In this case, the annular space may serve as a non-metallic layer for restraining the heat transfer.

The endless belt 66 may be replaced by a non-endless tape or strip, supplied from a roll, for example.

As is apparent from the foregoing description, the heating and platen rolls 2, 4 of the calendering device 20 and the first and second rolls 62, 64 of the heating device 56 also serve as a feeding device for feeding the developer sheet 29 as a recording sheet having the image-bearing surface.

Referring to next to FIGS. 12 through 20, there are shown several other modified forms of a heating device 74, 76, 78, 80, 82 and 83, with or without a separate feeding device for feeding the developer sheet 29. These heating devices are substituted for the calendering or heating device 20, 56 of the preceding embodiments of FIGS. 4, 7 and 9.

Figure 12:
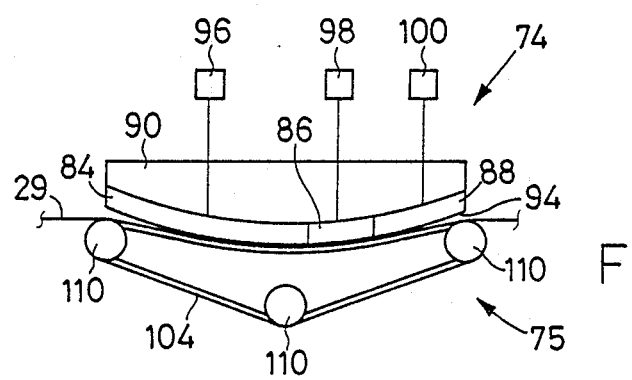
FIG. 12 is an elevational view of a modified heating device and a feeding device used in a still further embodiment of the invention.

The heating device 74 shown in FIG. 12 includes three heaters 84, 86, 88 which are arranged on a support member 90 in the feeding direction of the developer sheet 29. The support member 90 has a part-cylindrical surface corresponding to a portion of a cylinder whose centerline extends perpendicular to the feeding direction of the developer sheet 29. The heaters 84, 86 and 88 are secured to the part-cylindrical surface of the support member, such that the lower surfaces of the heaters 84, 86 and 88 provide a heating surface 94.

The heater 84 of the three heaters 84, 86 and 88 constitutes an inlet portion of the heating device 74 through which the developer sheet 29 enters the heating device. This inlet-side heater 84 has a surface area which is slightly larger than a half of the entire heating surface 94. The intermediate heater 86, and the outlet-side heater 88 have almost the same surface areas, a sum of which is equal to the remaining area of the heating surface 94. The heaters 84, 86 and 88 are connected to respective controllers 96, 98 and 100, so that the operating temperatures of the heaters are maintained at predetermined levels. While the optimum heating temperature for providing the heated developer sheet 29 with a sufficiently high level of glossiness is about 150° C., the temperature of the inlet-side heater 84 is controlled to be lower than that optimum level. The intermediate and outlet-side heaters 86, 88 are controlled so as to have an intermediate temperature and a highest temperature, respectively. In the instant embodiment, these three heaters 84, 86 and 88 are controlled so that their temperatures are maintained at 140° C., 150° C. and 160° C., respectively.

Figure 13:
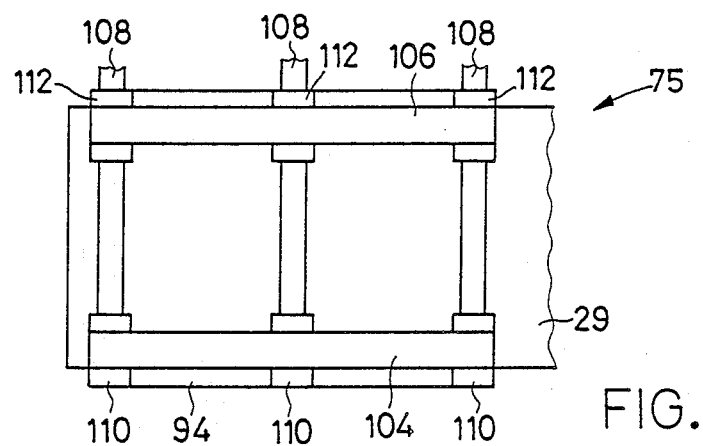
FIG. 13 is a bottom plan view of the feeding device of FIG. 12.

Below the heating device 74, there is disposed a separate feeding device 75 which includes a pair of endless belts 104, 106 as shown in FIG. 13. These endless belts 104, 106, which constitute major components of the feeding device 75, are aligned with two width portions of the heating surface 94 which are spaced apart from each other in the direction of width of the surface 94, i.e., in the direction perpendicular to the feeding direction of the developer sheet 29. The two endless belt 104, 106 are adapted to be in contact with the corresponding margin portions of the image-bearing surface of the developer sheet 29, which margin portions do not have images recorded thereon. Each of the endless belts 104, 106 is supported and guided by three rollers 110, 112 which are rotatably mounted on respective shafts 108. In operation, the support member 90 of the heating device 74 is moved toward the feeding device 75 by a presser mechanism (not shown), whereby the belts 104, 106 are held in close contact with the heating surface 94. One of the three shafts 108 which is located at the downstream end of the feed path of the developer sheet 29 is positively driven by a motor. Thus, the belts 104, 106 are rotated in the longitudinal direction, while being guided by the rotating rollers 110, 112, whereby the developer sheet 29 is fed in pressed sliding contact with the heating surface 94.

In the image transfer system incorporating the heating device 74 and the feeding device 75 which are constructed as described above, the developer sheet 29 is first heated by the inlet-side heater 84. Since the temperature of this heater 84 is made lower than the temperature necessary to give the developer sheet a sufficient glossiness level, the heated surface of the developer sheet 29 does not have bubbles or other surface roughening defects. As the developer sheet 29 moves on the 140° C. surface of the inlet-side heater 84 whose surface is about the half of the entire area of the heating surface 94, the temperature of the developer sheet 29 is gradually raised to 140° C., before the sheet 29 contacts the intermediate heater 86 whose temperature is 150° C. In this arrangement, the developer sheet 29 is subjected to 150° C. only after it is pre-heated up to 140° C. Consequently, the heated developer sheet 29 does not suffer from bubbling or foaming phenomenon which would occur where the cold sheet 29 is heated directly to the temperature at which the sheet 29 is given a sufficient glossiness. The developer sheet 29 is further heated by the outlet portion of the heating surface 94, whereby the glossiness and smoothness of the image-bearing surface of the developer sheet 29 are sufficiently enhanced.

Further, since the endless belts 104, 106 for feeding the developer sheet 29 are adapted to contact the margin portions of the sheet 29, the heated imaged portion of the developer sheet 29 in a more or less molten or softened state is protected from being blurred due to contact with the belts 104, 106, which may cause the images to be transferred to the belts. In this respect, too, the instant heating and feeding arrangement 74, 75 assures improved quality of the images formed on the developer sheet 29.

Figure 14:
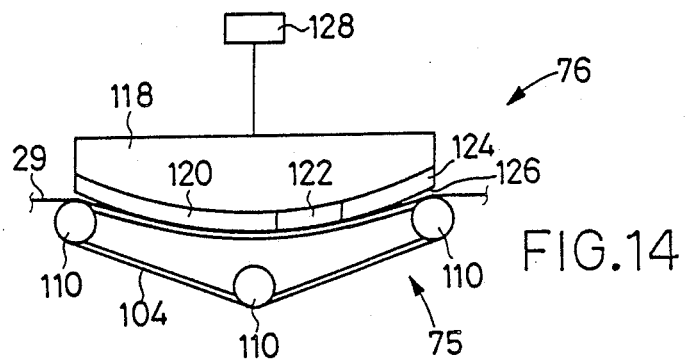
FIG. 14 is an elevational view of a further modified form of the heating device.

Referring to FIG. 14, the heating device 76 uses a single heater 118 whose part-cylindrical surface is covered by three heat-conductive sheets 120, 122, 124 secured thereto. These heat-conductive sheets 120, 122, 124 have the same thickness, but different values of thermal conductivity. These heat-conductive sheets provide a heating surface 126. The heat-conductive sheet 120 disposed on the inlet side of the heating device 76 has the lowest thermal conductivity, and has a surface area which is slightly larger than a half of the entire area of the heating surface 126. The intermediate sheet 122 having an intermediate thermal conductivity and the outlet-side sheet 124 having the highest thermal conductivity, have substantially the same areas, a sum of which is equal to the remaining area of the heating surface 126.

The heater 118 is connected to a controller 128, so that the operating temperature of the heater 118 is maintained at a predetermined level. The thermal conductivities of the heat-conductive sheets 120, 122, 124 are determined so that the corresponding portions of the heating surface 126 during energization of the heater 118 are maintained at 140° C., 150° C. and 160° C. According to this arrangement, the heating surface 126 has a lower temperature at the inlet portion than at the outlet portion, so that the developer sheet 29 is not rapidly heated to the temperature at which the developer sheet 29 is given a sufficiently high level of glossiness. Thus, the instant arrangement also permits the developer sheet to be processed so as to have a smooth and glossy image-bearing surface.

The heat-conductive sheets 120, 122, 124 may be replaced by a heat-conductive sheet secured to the heater 118. This sheet has a comparatively low thermal conductivity, and its thickness decreases in the feeding direction from the inlet portion toward the outlet portion of the heating device 76. In this case, too, the temperature of the heating surface of the heating device is lower at the inlet portion that at the outlet portion. The thickness of the heat-conductive sheet may increase in steps or continuously, for changing the heating surface temperature in steps or continuously.

Figure 15:
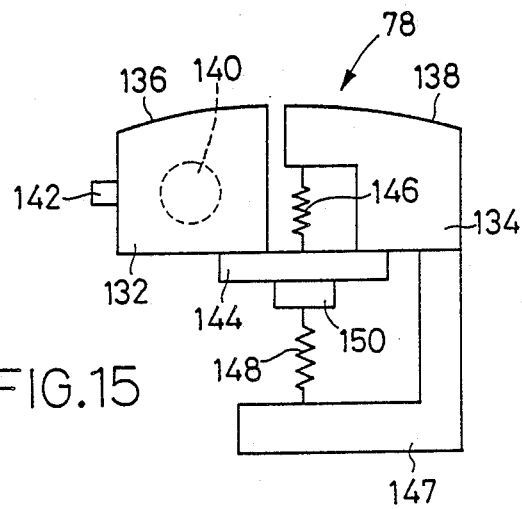
FIG. 15 is an elevational view of a still further modification of the heating device.
Figure 16:
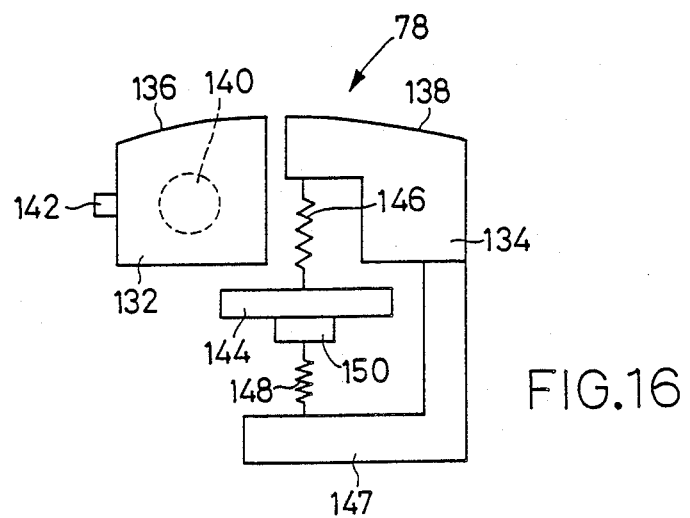
FIG. 16 is an elevational view of the heating device of FIG. 15 in a different operating state.

Referring to FIGS. 15 and 16, the heating device 78 is disposed below the feeding path of the developer sheet 29. This heating device 78 includes a primary heating member 132 and an auxiliary heating member 134. The primary heating member 132 is disposed downstream of the auxiliary heating member 134 as viewed in the feeding direction of the developer sheet 29, such that there exists a slight gap between the two heating members 132, 134. The heating members have respective heating surfaces 136, 138 which are portions of a cylindrical surface of a cylinder whose centerline is perpendicular to the feeding direction of the developer sheet.

The primary heating member 132 is provided with a heat-generating source in the form of a halogen lamp 140, and a thermistor 142 which produces an electrical output signal indicative of a temperature of the primary heating member 132. The output of the halogen lamp 140 is controlled based on the output signal from the thermistor 142, so that the temperature of the primary heating member 132 is maintained at a predetermined level (180° C. in the present embodiment).

The auxiliary heating member 134 is heated by heat transferred from the primary heating member 132 through a heat-conductive member 144. This heat-conductive member 144 is disposed below the two heating members 132, 134, and is biased in the upward direction by a tension spring 146 secured to the auxiliary heating member 134. At the same time, the heat-conductive member 144 is biased in the downward direction by a tension spring 148 connected at its one end to a support member 147, and at its other end to an abiabatic member 150 secured to the heat-conductive member 144. The tension spring 148 is made of an alloy which exhibits a thermal shape memory effect of deformation. More specifically, the tension spring 148 has an elongated shape as shown in FIG. 15, at a normal or room temperature. When the spring 148 is heated to an elevated temperature (80° C. in the present embodiment), the spring 148 is reverted to its original contracted shape as shown in FIG. 16. The tensile force of the spring 148 in its elongated position is smaller than that of the spring 146. However, the tensile force of the spring 148 exceeds that of the spring 146 when the spring 148 is restored to its contracted position. In the present embodiment, too, the developer sheet 29 is fed by a pair of endless belts as used in the feeding device 75 of FIGS. 12 and 13.

In the heating device 78, the heat-conductive member 144 is held in contact with the primary and auxiliary heating members 132, 134 before the heating device 78 is activated. Upon energization of the halogen lamp 140, the primary and auxiliary heating members 132, 134 are heated. As the heating continues, the tension spring 148 is also heated by the heat transferred from the auxiliary heating member 134 via the support member 147. When the temperature of the spring 148 reaches 80° C., the spring 148 is reverted to its original contracted shape, whereby the heat-conductive member 144 is moved away from the heating members 132, 134. Consequently, the heat transfer to the auxiliary heating member 134 is discontinued, and the temperature of the heating member 134 is lowered. As a result, the temperature of the spring 148 is lowered, and the spring 148 begins to assume its elongated shape, whereby the heat-conductive member is eventually brought into contact with the heating members 132, 134. Therefore, the auxiliary heating member 134 is again heated. Thus, the repeated contraction and elongation of the tension spring 148 causes the repeated movements of the heat-conductive member 144, so as to effect intermittent contacts with the heating members 132, 134. In this manner, the temperature of the auxiliary heating member 134 is maintained at a temperature in the neighborhood of 80° C. at which the tension spring 148 is reverted to its contracted position due to its thermal shape memory effect of deformation.

According to the above arrangement, the developer sheet 29 is first heated by the inlet-side auxiliary heating member 134 having a lower heating temperature, and then heated by the outlet-side primary heating member 132 having a higher heating temperature. Therefore, the developer sheet 29 is not heated rapidly. Thus, the instant heating device 78 also assures high quality glossy images on the image-bearing surface of the heated developer sheet 29. Since the auxiliary heating member 134 is heated by the heat transferred from the primary heating member 132, the instant heating device 78 requires only a single heat-generating source, and is consequently available at a reduced cost.

It is possible that the spring 148 and the support member 178 are enclosed by a suitable covering member so that the spring 148 is heated in an enclosed atmosphere which is heated by radiant heat from the auxiliary heating member 134.

Also, the spring 148 made of an alloy exhibiting a thermal shape memory effect may be replaced by a bimetal which is operated so as to effect intermittent contacts of the heat-conductive member 144 with the primary and auxiliary heating members 132, 134.

Figure 17:
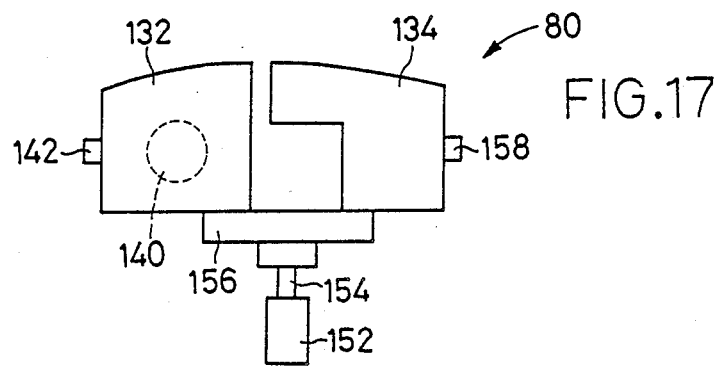
FIG. 17 is an elevational view of a yet further modified heating device.
Figure 18:
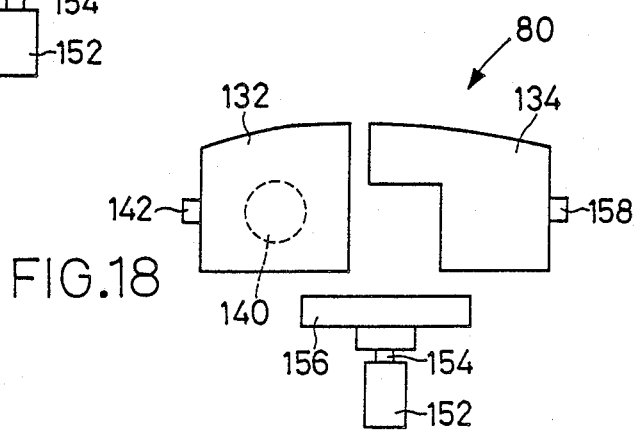
FIG. 18 is an elevational view of the heating device of FIG. 17 in a different operating state.

In the further modified heating device 80 shown in FIGS. 17 and 18, a solenoid 152 is substituted for the spring 148, for operating a heat-conductive member 156 between two positions as indicated in the figures, in order to maintain the temperature of the auxiliary heating member 134 at the predetermined level. The solenoid 152 is connected to the heat-conductive member 156 by a plunger 154, and is energized and deenergized based on an output signal from a thermistor 158 provided on the auxiliary heating member 134. Thus, the plunger 154 is reciprocated to move the heat-conductive member 156 between the two positions, for intermittent contacts with the two heating members 132, 134, so as to maintain the auxiliary heating member 134 at the predetermined temperature.

Figure 19:
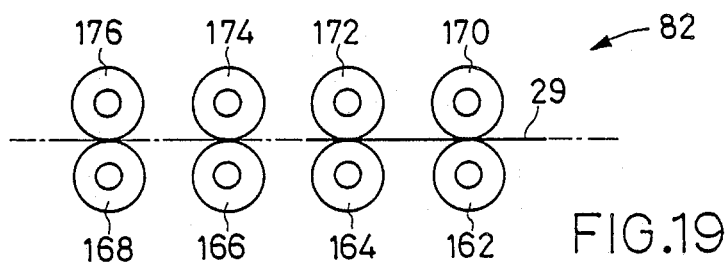
FIGS. 19 and 20 are elevational views showing modified calendering devices, respectively.

While the heating devices 74, 76, 78 and 80 described above all have the heating surface which is adapted to slidably contact the surface of the developer sheet 29, the heating devices may be replaced by a calendering device 82 as shown in FIG. 19. This calendering device 82 uses four heating rolls 162, 164, 166, 168, each of which incorporates therein a heat-generating source. The rolls 162, 164, 166, 168 have rotating axes which extend in the width direction of the developer sheet 29, and which are spaced apart from each other in the feeding direction of the developer sheet 29. The operating temperatures of these heating rolls 162, 164, 166, 168 are determined so as to increase in the feeding direction. For instance, the heating roll 162 at the inlet end of the device 82 is heated to 140° C., and the following rolls 164 and 166 are heated to 145° C. and 150° C., respectively. Further, the heating roll 168 at the outlet end of the device 82 is heated to 200° C. Above the heating rolls 162, 164, 166, 168, there are disposed respective feed rolls 170, 172, 174, 176 which are positively driven. These feed rolls cooperate with the heating rolls to nip the developer sheet 29 therebetween, thereby feeding the developer sheet 29 while heating the same.

In the present calendering device 82, the developer sheet 29 is not heated rapidly to a high temperature, since the operating temperature of the inlet-side heating roll 162 is selected to be lower than a level at which the heated developer sheets 29 undergoes a bubbling or foaming phenomenon. In other words, the developer sheet is first heated to 140° C., and its temperature is gradually raised up to 150° C. in increments of 5° C. Finally, the developer sheet 29 passes the outlet-side heating roll 168 whose temperature is 200° C. According to this arrangement, the heated developer sheet is effectively protected otherwise possible bubbles or other surface roughening defects.

Figure 20:
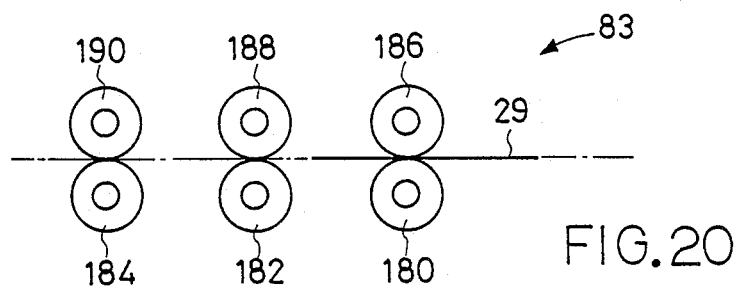

Referring to FIG. 20, the calendering device 83 uses three heating rolls 180, 182, 184. The operating temperatures of the inlet-side roll 180 and the intermediate roll 182 are both set at 145° C., and the operating temperature of the outlet-side roll 184 is set at 160° C. Reference numerals 186, 188, 190 designate feed rolls which cooperate with the heating rolls 180, 182 and 184 to feed the developer sheet 29.

In the calendering device 83, the developer sheet 29 is heated by the two heating rolls of the same operating temperature, whereby the sheet 29 is gradually or completely heated to 145° C. Due to this preliminary heating, the developer sheet 29 does not suffer from bubbling at the next heating stage at 160° C. The present calendering device 83 also assures smooth glossy image-bearing surface of the developer sheet 29.

Figure 21:
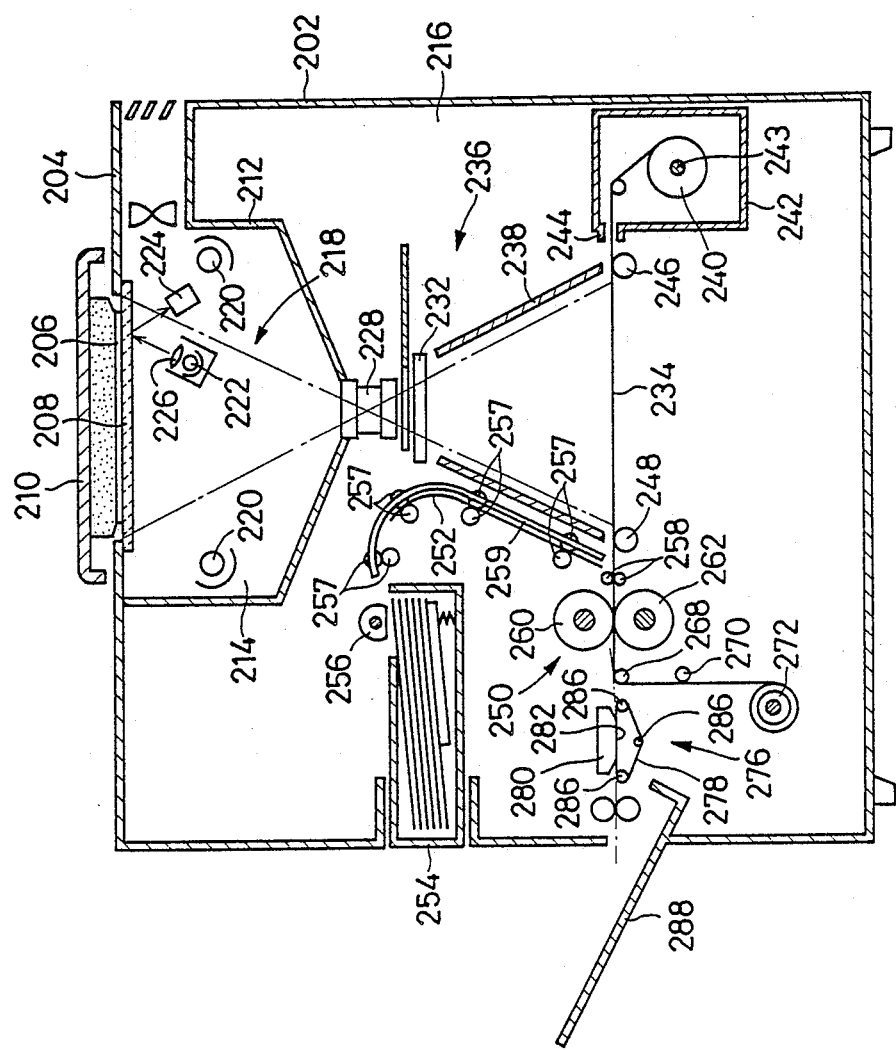
FIG. 21 is a front elevational view in cross section of a further embodiment of the invention.
Figure 22:
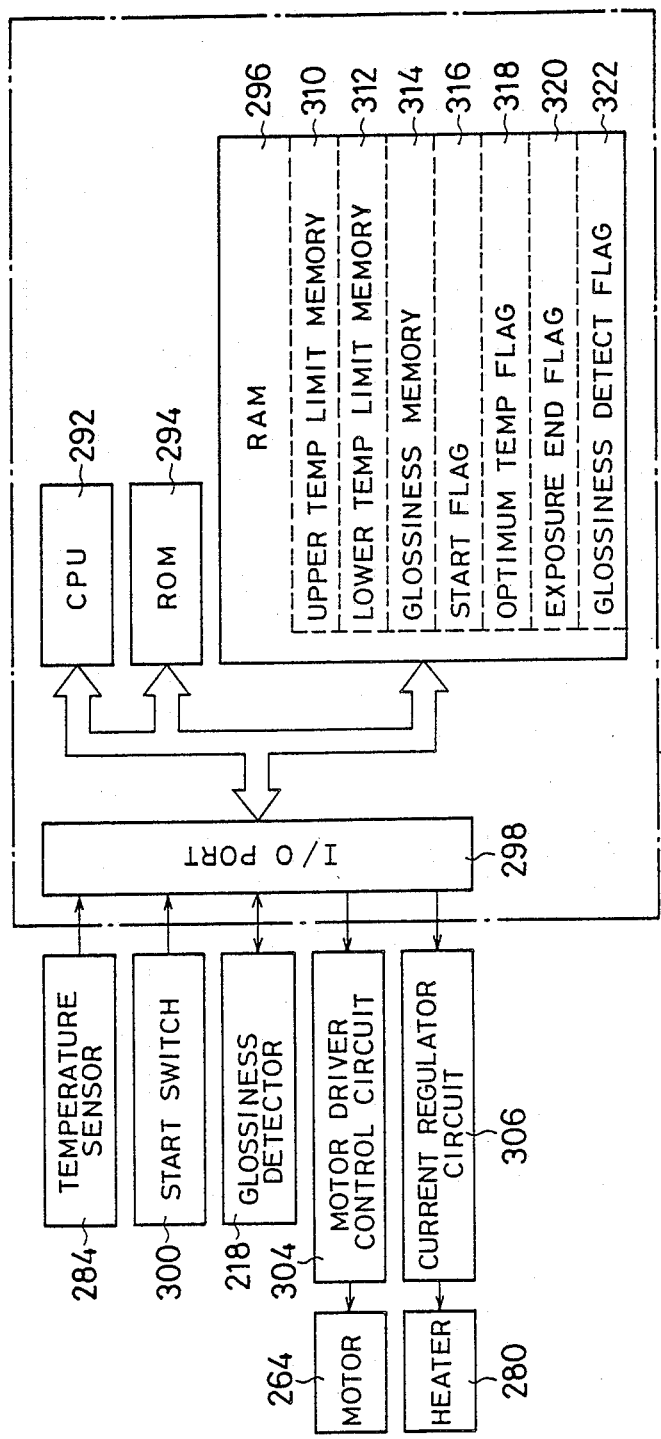
FIG. 22 is a schematic block diagram showing a control system of the embodiment of FIG. 21.

Referring next to FIGS. 21 through 25, there will be described a further embodiment of the present invention, in the form of an image transfer system. In FIG. 21, reference numeral 202 designates a box-like housing 202 having a top wall 204 on which a transparent support plate 208 is fixed. An original 206 having an image-bearing surface is placed on the support plate 208, such that the image-bearing surface having source image information is in contact with a top surface of the support plate 208. The original 206 placed on the support plate 208 is covered by a covering 210.

The interior of the housing 202 is divided by a partition wall 212 suspended from the top wall 204, into an illuminating room 214 and a darkroom 216. Within the illuminating room 214, there are disposed a glossiness detector 218, and a pair of light sources 220, 220. The glossiness detector 218 includes a light source 222 for generating a radiation for illuminating the image-bearing surface of the original 206, and a photosensor 224 for sensing an amount of the radiation reflected by the original 206. The radiation generated by the light source 222 travels through a lens 226 and strikes the original 206. The amount of regular reflection of the radiation (light rays reflected at an angle equal to the incident angle) varies depending upon the glossiness level of the image-bearing surface of the original 206. This amount of regular reflection is represented by an output signal generated from the photosensor 224. The glossiness detector 218 is moved by a feeding device (not shown) in the direction perpendicular to the plane of FIG. 21, between its operative position beneath the original 206, and its inoperative or retracted position at which the detector 218 does not interfere with the radiations produced by the light sources 220, 220 for image-wise exposing a photosensitive sheet 234.

The partition wall 212 has a lens 228 fixed to its bottom. The radiations generated by the light sources 220, 220 are reflected by the image-bearing surface of the original 206, and condensed by the lens 228. The condensed radiation passes a shutter 232 and travels through the darkroom 216 in which the photosensitive sheet 234 is fed. The photosensitive sheet 234 is image-wise exposed to the radiation, so as to form latent images thereon, according to the images on the illuminated image-bearing surface of the original 206. In the present embodiment, the partition wall 212, light sources 220, lens 228, etc. constitute an exposing device 236 for image-wise exposing the photosensitive sheet 234. The shutter 232 is open permitting passage of the radiation from the lens 228, while the system is in an image-forming state. Reference numeral 238 designates a shielding plate for protecting the photosensitive sheet 234 from being exposed to light rays other than the radiation which has passed the lens 228.

The photosensitive sheet 234, which is identical with the photosensitive sheet 15 shown in FIGS. 2 and 3, is supplied from a roll 240 rotatably supported by a shaft 243 fixed in a casing 242. The photosensitive sheet 234 is stretched through a guide portion 244 formed on the casing 242, and is guided by guide rollers 246, 248 so as to extend right below the lens 228.

A developing device 250, and a cassette 254 accommodating developer sheets 252 as a recording sheet are disposed in a portion of the darkroom 216 which is downstream of the image-wise exposed portion of the photosensitive sheet 234, in the feeding direction of the sheet 234. The developer sheet 252 has a developer layer made of a developing material bonded by polyvinyl alcohol. The cassette 254 is positioned above the feed path of the photosensitive sheet 234, and the developer sheet 252 is fed out of the cassette 254 by a feed roller 256, and is directed to a pair of feed rollers 258 while being guided by a plurality of pairs of guide rollers 257, and a guide 259. The developer sheet 252 fed to the feed rollers 258 is superposed on the already exposed portion of the photosensitive sheet 234, before the exposed portion is developed by the developing device 250. The superposed developer sheet 252 and exposed portion of the sheet 234 are fed by the feed rollers 258, toward the developing device 250.

The developing device 250 includes a pair of presser rollers 260, 262. The presser roller 260 is coupled to a drive motor 264 shown in FIG. 22, while the presser roller 262 is biased toward the presser roller 260 by a presser mechanism not shown. In this arrangement, the presser roller 262 is rotated with the positively driven presser roller 260, so that the photosensitive sheet 234 and the developer sheet 252 are passed through the nip of the two rotating rollers 260, 262, whereby the latent images on the photosensitive sheet 234 are developed into visible images on the developer sheet 252, in the same manner as previously described with respect to the first embodiment of FIGS. 4 and 5. In the present embodiment, the exposing device 236 and the developing device 250 constitute an image-forming assembly.

The photosensitive sheet 234 which has passed the nip of the developing device 250 is guided by guide rollers 268, 270 and re-wound on a take-up reel 272. This take-up reel 272 is connected to the motor 264 via a friction clutch, so that the length of the photosensitive sheet 234 to be re-wound on the take-up reel 272 is equal to the length to be fed by the presser rollers 260, 262. The feed rollers 258 indicated above are also driven by the motor 264 so that the peripheral speed of the rollers 258 is the same as that of the presser roller 260.

On the other hand, the developer sheet 252 is fed to a glossiness improving device 276 which includes a pair of endless belts 278 (only one belt being shown in FIG. 21), and a heating device in the form of a heater 280. The heater 280 is disposed above the feed path of the developer sheet 252, such that its lower surface serves as a part-cylindrical heating surface 282 whose centerline is perpendicular to the feeding direction of the developer sheet 252. The operating temperature of the heating surface 282 can be adjusted by controlling an electric current to be applied to the heater 280. The temperature of the heating surface 282 is sensed by a temperature sensor 284 indicated in FIG. 22.

The pair of endless belts 278 are disposed under the heater 280, and are aligned with corresponding width portions of the heating surface 282 which correspond to margin portions of the developer sheet 252 that are spaced apart from each other in the width direction of the heating surface 282 (perpendicular to the feeding direction of the developer sheet 252), as described with respect to the embodiment of FIGS. 12 and 13. The endless belts 278 are guided by three rotatably supported rollers 286, and are held in pressed contact with the heating surface 282 of the heater 280, such that the heater 280 is forced toward the belts 278 by a presser mechanism not shown. One of the guide rollers 286 which is located at the downstream end of the belts 278 is driven by the motor 264 for the presser roller 260. With the belts 278 thus rotated in the longitudinal direction, the developer sheet 252 is fed while being pressed against the heating surface 282. Due to heat applied to the developer sheet 252, the developing material and polyvinyl alcohol of the developer sheet 252 are fused or softened, whereby the image-bearing surface of the sheet 252 is smoothed and glossed, and the images formed thereon are fixed. The thus heat-treated developer sheet 252 is delivered onto a tray 288. The belts 278 are operated to feed the developer sheet 252 at the same speed as the feeding speed of the presser roller 260 and the feed rollers 258. The belts 278 and the motor 264 constitute a feeding device for feeding the developer sheet 252.

The image-forming operation of the image transfer system constructed as described above is controlled by a computer 290. The computer 290 includes a CPU (central processing unit) 292, a ROM 294 (read-only memory), and a RAM (random-access memory) 296. The temperature sensor 284 indicated above, a recording start switch 300, and the glossiness detector 218 indicated above are connected through an I/O port 298 to the CPU 292, ROM 294 and RAM 296. Further, the motor 64 and the heater 280 are connected to the CPU 292, ROM 294 and RAM 296, through a motor control driver circuit 304 and a current regulator circuit 306, respectively.

The RAM 296 includes an UPPER TEMP LIMIT memory 310, a LOWER TEMP LIMIT memory 312, a GLOSSINESS memory 314, a START flag 316, an OPTIMUM TEMP flag 318, an EXPOSURE END memory 320, and a GLOSSINESS DETECT flag 322. The ROM 294 stores control programs stored in the flow charts of FIGS. 23-25, sheet feeding rates, and heating temperature data necessary to provide different glossiness levels of the developer sheets 252. It is noted that the glossiness level of the developer sheet 252 can be varied by changing the heating temperature provided the sheet 252 is fed at the same rate. Accordingly, optimum ranges of the heating temperature may be determined corresponding to different ranges of the glossiness level detected by the glossiness detector 218. The heating temperature data stored in the ROM 294 represent upper and lower limits of the heating temperature which define an optimum range for each predetermined range of the glossiness level. The appropriate temperature range is selected based on the glossiness level of the original 206 detected by the glossiness detector 218. The CPU 292 operates to control the image transfer operation of the instant system, according to the programs stored in the ROM 294.

Referring to the flow charts of FIGS. 23-25, there will be described the operation to transfer images from the original 206 to a recording sheet in the form of the developer sheet 252, so as to provide the developer sheet 252 with a glossiness level which corresponds to the glossiness of the image-bearing surface of the original 206.

Figure 23:
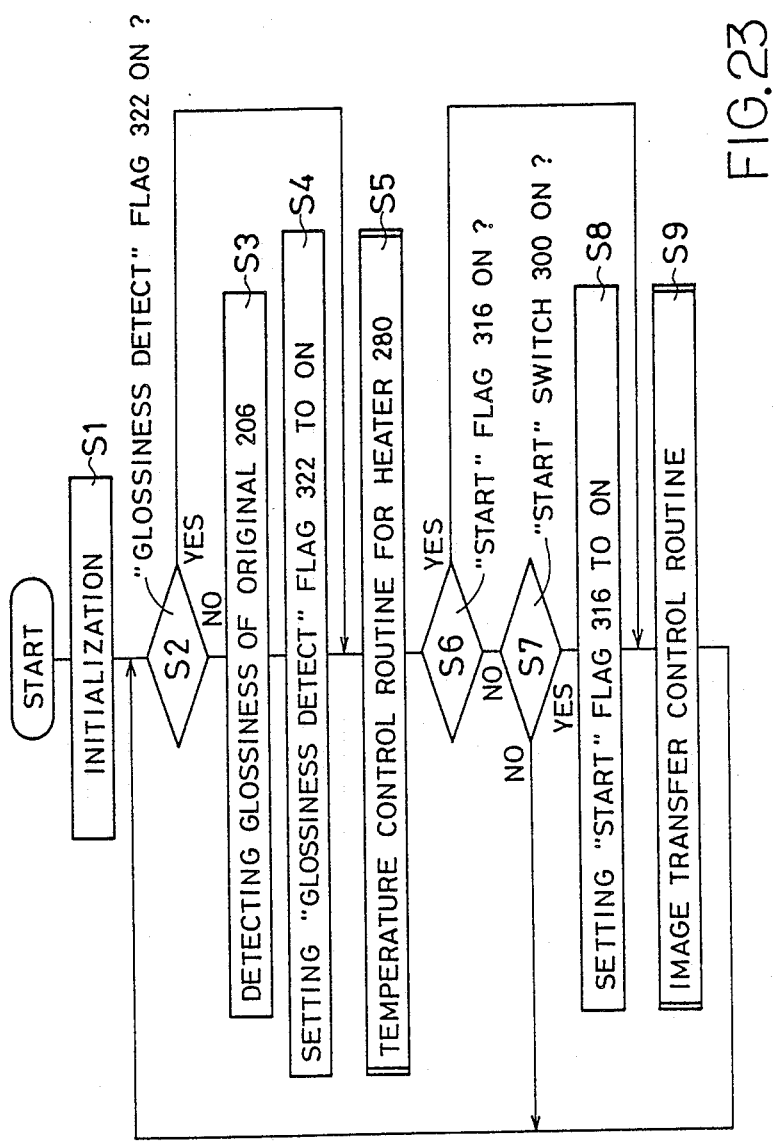
FIGS. 23 through 25 are flow charts illustrating control programs stored in a read-only memory of a computer which constitutes a major portion of the control system of FIG. 22.

When the image transfer system is turned on, step S1 of a main control program of FIG. 23 is implemented to perform an initializing operation, in which the flags 316, 318, 320 and 322, and other control elements are reset. Then, step S2 is executed to determine whether the GLOSSINESS DETECT flag 322 is ON or not. In the first execution of this step S2, a negative decision (NO) is obtained, and the step is followed by step S4 to detect the glossiness of the original 206. Described more specifically, the light source 222 is energized to illuminate the image-bearing surface of the original 206, whereby the photosensor 224 produces an output signal indicative of an amount of radiation reflected by the image-bearing surface. The computer 290 receives the output signal from the photosensor 224, and converts the received signal into a glossiness-level signal. This glossiness-level signal is stored in the GLOSSINESS memory 314. Step S3 is followed by step S4 wherein the GLOSSINESS DETECT flag 322 is set to ON. Then, the control goes to step S5 in which the heater 280 is controlled, according to a temperature control routine illustrated in the flow chart of FIG. 24.

In the temperature control routine, step S101 is initially executed to retrieve the glossiness-level signal from the GLOSSINESS memory 314, and retrieves from the ROM 294 the upper and lower limits of the heating temperature which correspond to the detected glossiness level represented by the retrieved glossiness-level signal. The retrieved upper and lower limits are stored in the UPPER TEMP LIMIT memory 310 and the LOWER TEMP LIMIT memory 312, respectively. Step S101 is followed by step S102 to determine whether a heating temperature T of the heater 280 measured by the temperature sensor 284 is higher than the upper limit A stored in the UPPER TEMP LIMIT memory 310. In this control cycle immediately after the power application to the system, the temperature T is substantially equal to the ambient or room temperature, and is therefore lower than the upper limit A, whereby a negative decision (NO) is obtained in step S102. Step S102 is followed by S103 to determine whether the temperature T is equal to or lower than the lower limit B stored in the LOWER TEMP LIMIT memory 312. Since the temperature T of the heater 280 at this moment is substantially equal to the room temperature, an affirmative decision (YES) is obtained in step S103. The control then goes to step S104 to energize the heater 280 by applying a relatively large current thereto. The control then returns to the main control routine of FIG. 23.

When a certain period of time has passed after the energization of the heater 280, the heating temperature T of the heater 280 exceeds the lower limit B (but is lower than the upper limit A), and a negative decision (NO) is obtained in step S103, whereby step S105 is executed to reduce the energization current to be applied to the heater 280, so as to maintain the temperature T within the range between the upper and lower limits A-B. In this case, too, the control returns to the main control routine. If the temperature T exceeds the upper limit A, an affirmative decision (YES) is obtained in step S102, and the control goes to step S106 to deenergize the heater 280, for allowing the heater 280 to be cooled. Step S106 is also followed by the main control routine.

Figure 24:
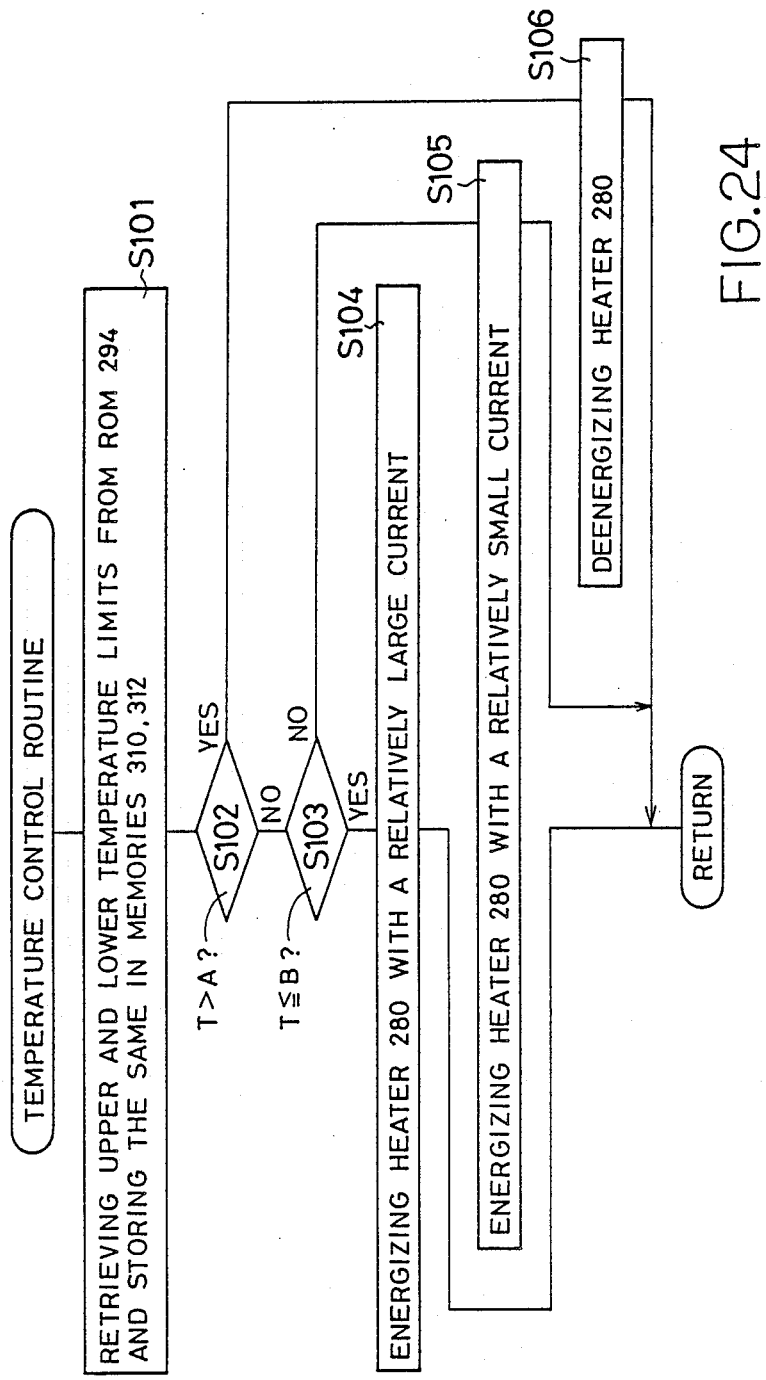

After the temperature control routine of FIG. 24 is completed, the control executes step S6 of the main control routine of FIG. 23, to determine whether the START flag 316 is set at ON, or not. Since this flag 316 remains OFF until the START switch 300 is turned ON, a negative decision (NO) is obtained in step S6, and the control goes to step S7 to determine whether the START switch 300 is turned ON, or not. If this switch 300 has not been set to ON, the control goes back to step S2 and to step S5, so that steps S5-S7 are repeatedly executed until the START switch 300 is turned ON. Upon turning ON the START switch 300, an affirmative decision (YES) is obtained in step S7, whereby step S8 is implemented to set the START flag 316 to ON. Subsequently, an image transfer control routine S9 is initiated.

Figure 25:
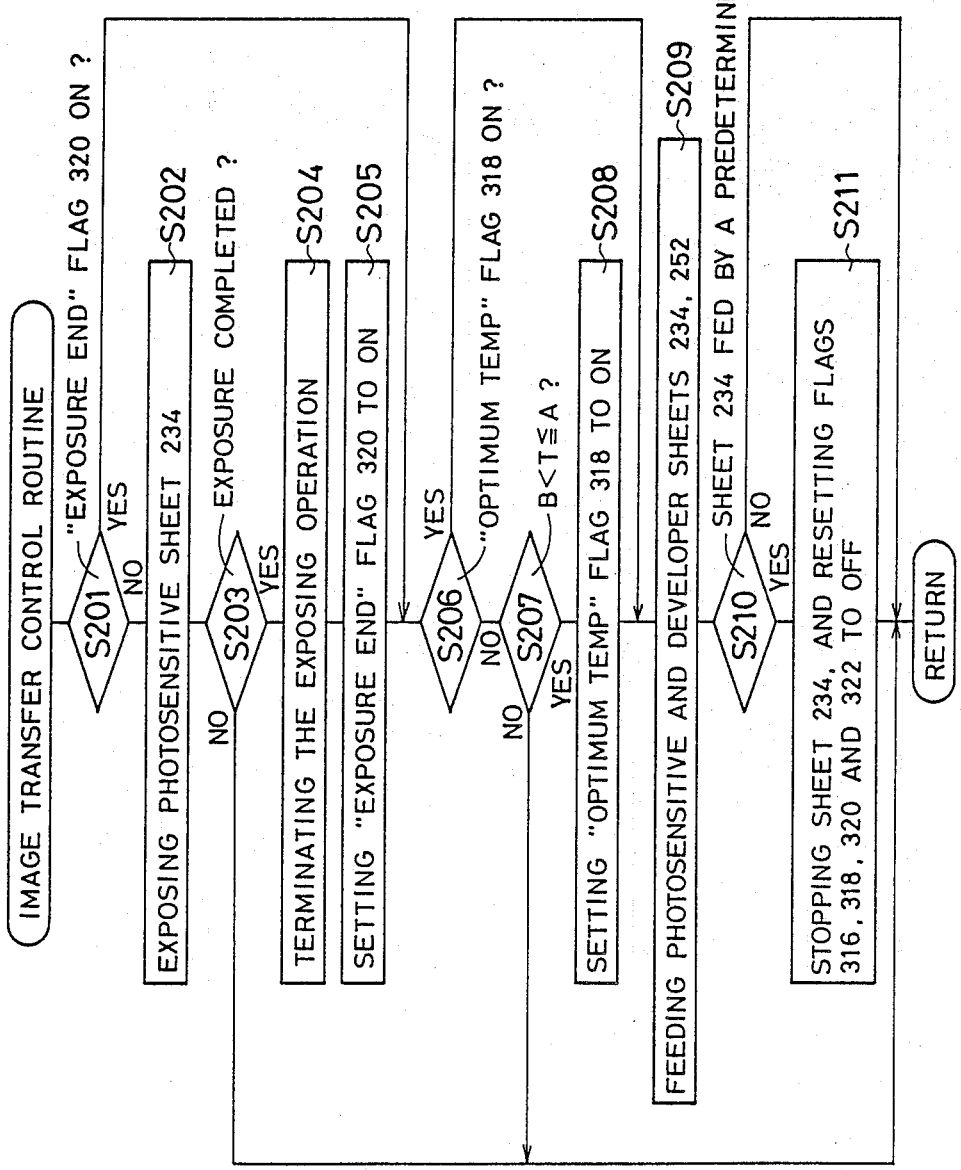

The image transfer control routine S9 is executed according to the flow chart of FIG. 25. Initially, step S201 is executed to determine whether the EXPOSURE END flag 320 is set at ON, or not. Since the exposing of the photosensitive sheet 234 has not been started at this time, a negative decision (NO) is obtained in step S201, and the exposure of the photosensitive sheet 234 is commenced in step S202. Then, the control determines in step S203 whether to terminate the exposing operation or not, namely, whether a predetermined exposing time has elapsed after the commencement of the exposure. In an initial period immediately following the commencement of the exposure, a negative decision (NO) is made in step S203, whereby the control returns to the main control routine, to repeat the main control routine, the temperature control routine, and steps S201-S203 of the image transfer control routine, until an affirmative decision (YES) is obtained in step S203. However, steps S3, S4, S7 and S8 are skipped since the START flag 316 and the GLOSSINESS DETECT flag 322 have been set at ON.

When an affirmative decision (YES) is obtained in step S203, the exposing operation is terminated in step S204. Then, the EXPOSURE END flag 320 is set to ON in step S205, and the control goes to step S206 to determine whether the OPTIMUM TEMP flag 18 is set at ON. In the first execution of step S206, a negative decision (NO) is obtained, since the OPTIMUM TEMP flag 318 remains OFF until an affirmative decision (YES) is obtained in the following step S207, even if the actual temperature T at the heating surface 282 of the heater 280 falls within the range defined by the upper and lower limits A, B. If a negative decision (NO) is obtained in step S207, the control returns to the main control routine, and repeats the main control routine, the temperature control routine, and steps S201-S207, until an affirmative decision (YES) is obtained in step S207. In this case, too, steps S3, S4, S7 and S8 are skipped. Further, steps S202-S205 are also skipped since the EXPOSURE END flag 320 has been set to ON.

When an affirmative decision (YES) is obtained in step S207, the OPTIMUM TEMP flag 318 is set to ON in step S208. Subsequently, step S209 is implemented to start feeding the photosensitive sheet 234 and the developer sheet 252. It follows from the above description that the feeding of the photosensitive and developer sheets 234, 252 is initiated only after the temperature T of the heater 280 has been raised to an optimum level necessary to provide the developer sheet 252 with a glossiness corresponding to the detected glossiness of the original 206. To feed the sheets 234, 252, the motor 264 is controlled so that the sheets are fed at a rate retrieved from the ROM 294. In the next step S210, the control determines whether the motor 264 has been operated by a predetermined amount necessary to feed the sheets 234, 252 by a predetermined distance. That is, during this predetermined distance of movement, the superposed sheets 234, 252 must be passed through the nip of the rolls 260, 262 of the developing device 250, and the photosensitive sheet 234 must be re-wound on the take-up reel 272, while the already developed developer sheet 252 must be heated by the heater 280 and delivered onto the tray 288. The operating amount of the motor 264 is determined to achieve the above motions of the sheets 234, 252. In an early stage of the sheet feeding movement, a negative decision (NO) is obtained in step S210, and the control returns to the main control routine, and repeats the above-described control cycle, until an affirmative decision (YES) is obtained in step S210. In this instance, steps S3, S4, S7, S8, S202-S205, S207 and S208 are skipped.

Once the sheet feeding operation is started, the determination in step S207 of whether the temperature T of the heater 280 falls within the range between the upper and lower limits A, B is not executed. However, the current applied to the heater 280 is adjusted in the temperature control routine, based on the determinations in S102, S103 of whether the temperature T is higher than the upper limit A and whether the temperature T is equal to or lower than the lower limit B. Thus, the temperature T of the heating surface 282 is maintained between the upper and lower limits A, B. When an affirmative decision (YES) is obtained in step S210, the control executes step S211 wherein the motor 264 is turned off, and the flags 316, 318, 320 and 322 are reset to OFF. The control then returns to the main control routine.

In the manner described above, the developer sheet 252 is heated to a temperature suitable to improve the glossiness of its image-bearing surface to a level detected by the glossiness detector 218, while it is being fed after the developer sheet 252 and the exposed photosensitive sheet 234 have passed the developing device 250. Thus, the image-bearing surface of the heated developer sheet 252 is given a glossiness which corresponds to the glossiness of the original 206.

It follows from the foregoing description that a portion of the computer 290 which performs steps S1-S9, S101-S106 and steps S201-S211 constitutes a control device for controlling the heating temperature of the heater 280, so as to give the developer sheet a glossiness corresponding to the glossiness sensed by the glossiness detector 218.

In the above embodiment, the temperature of the heater 280 is controlled so as to give the developer sheet 252 the glossiness corresponding to that of the original 206, while maintaining the feed rate of the developer sheet 252 at a predetermined value. However, it is possible to control the glossiness of the developer sheet 252 by controlling the feed rate of the developer sheet 252 while maintaining the heating temperature at a predetermined level. In this case, the amount of heat per unit time transferred from the heater 280 to the developer sheet 252 is changed depending upon the controlled feed rate of the sheet 252, whereby the glossiness of the heated developer sheet 252 is changed. That is, the feed rate of the developer sheet 252 is controlled so that the sheet 252 is given a glossiness which corresponds to the glossiness of the original 206 which is detected by the glossiness detector 218. Since the feed rate can be immediately changed, the glossiness of the developer sheet 252 can be continuously varied by changing the feed rate.

It is also possible that both the heating temperature and the feed rate are controlled to control the glossiness of the developer sheet 252, rather than controlling one of the heating temperature and the feed rate.

Further, the heater 280 having the heating surface 282 for facial contact with the developer sheet 252 may be replaced by a heating roll which incorporates a suitable light source such as a halogen lamp. Also, the feeding device using the endless belts 278 may be replaced by other means such as feed rollers.

Figure 26:
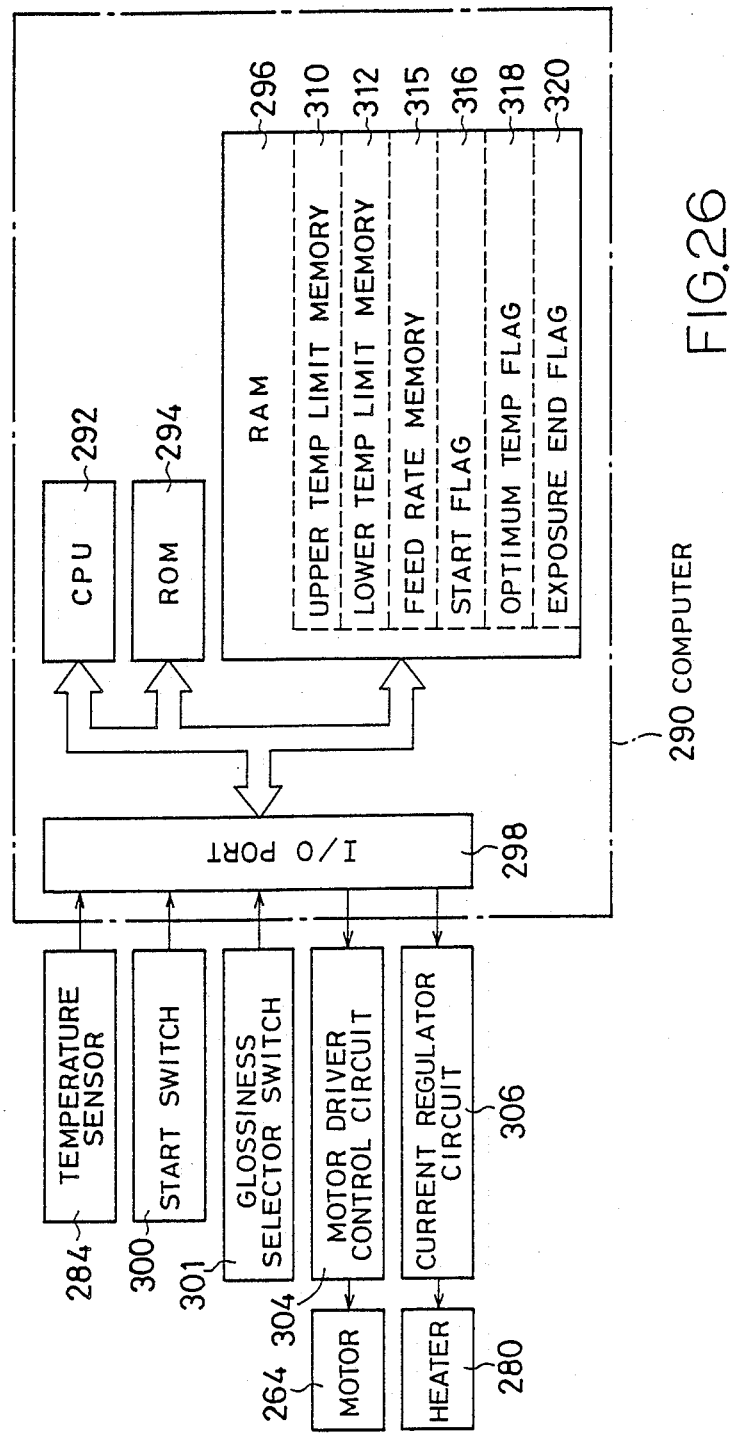
FIG. 26 is a schematic block diagram showing a control system of a still further embodiment of the invention, corresponding to that of FIG. 22.
Figure 27:
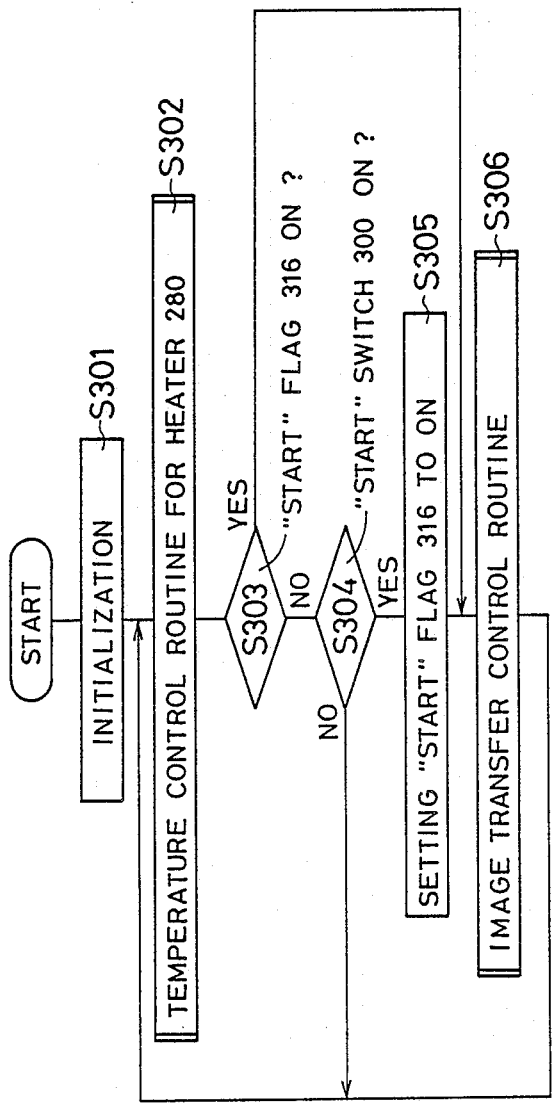

Referring next to FIGS. 26-28, a still further embodiment of the present invention will be described.

The present modified embodiment is identical with the preceding embodiment of FIGS. 21-25, with exceptions that the glossiness detector 218 is not provided, while a glossiness selector switch 301 is provided as indicated in FIG. 26. Further, the GLOSSINESS memory 314 is replaced by a FEED RATE memory 315 as also indicated in FIG. 26, and consequently the GLOSSINESS DEFECT flag 322 is not provided.

The glossiness selector switch 301 is disposed on an operator's control panel (not shown) attached to the housing 202. This selector switch 301 has two positions, i.e., ON and OFF positions, which are selected to give the heated developer sheet 252 with comparatively high and low glossiness levels, respectively.

The ROM 294 stores temperature and feed rate data corresponding to the ON and OFF positions of the glossiness selector switch 301. More specifically, the ROM 294 stores data representative of an upper limit of 120° C. and a lower limit of 100° C. of the heating temperature of the heater 280, and data representative of a feed rate of 35 mm/sec. for the sheets 234, 252. These data are retrieved when the selector switch 301 is placed in the ON position. The ROM 294 further stores data representative of an upper limit of 100° C. and a lower limit of 80° C. of the heating temperature, and data representative of a feed rate of 240 mm/sec. for the sheets 234, 252. These data are retrieved when the OFF position is selected on the selector switch 301.

The operation of the instant embodiment will be described by reference to the flow charts of FIGS. 27 and 28.

Initially, step S301 of a main control routine of FIG. 27 is executed to perform an initializing operation, which includes storing the temperature data of 100° C. and 80° C. into the UPPER TEMP LIMIT memory 310 and the LOWER TEMP LIMIT memory 312, respectively. These temperature data correspond to the OFF position of the glossiness selector switch 301. Then, step S302 is implemented to perform a temperature control routine similar to that of the flow chart of FIG. 24, for controlling the heating temperature of the heater 280. Step S101 of the temperature control routine in the present embodiment is different from that of FIG. 24 in the preceding embodiment, only in that the control retrieves in step S101 the temperature data stored in the memories 310, 312, in order to compare the measured actual temperature T with the retrieved data A, B in the following steps S102, 103. With the execution of the temperature control routine of FIG. 24, the heating temperature of the heater 280 is controlled.

Then, the control returns to step S303 of the main control routine. This step S303, and the following steps S304 and S305 are identical with steps S7 and S8 of the main control routine of FIG. 23. Step S305 is followed by step S306 wherein an image transfer control routine of FIG. 28 is implemented.

If it is desired to change the glossiness level of the developer sheet 252, the glossiness selector switch 301 must be operated to the appropriate ON or OFF position before the START switch 300 is turned ON. If the START switch 300 is turned ON without operating the glossiness selector switch 301, the glossiness level corresponding to the currently selected position of the switch 301 is obtained. The following description is provided assuming that the glossiness selector switch 301 is operated to the ON position prior to the activation of the START switch 300.

The image transfer control routine is effected according to the flow chart of FIG. 28. Initially, step S401 is executed to determine whether the glossiness selector switch 301 is set in the ON position or in the OFF position. In the present specific example wherein the switch 301 is currently placed in the ON position, an affirmative decision (YES) is obtained in step S401, and step S402 is implemented wherein the control retrieves from the ROM 294 the temperature data and feed rate data corresponding to the ON position of the switch 301, and stores the retrieved data in the UPPER TEMP LIMIT, LOWER TEMP LIMIT, and FEED RATE memories 310, 312 and 315. Namely, the data representative of the upper heating temperature limit of 120° C. is stored in the UPPER TEMP LIMIT memory 310, while the data representative of the lower heating temperature limit of 100° C. is stored in the LOWER TEMP LIMIT memory 312. Further, the data representative of the feed rate of 35 mm/sec. is stored in the FEED RATE memory 315.

Then, the control goes to step S403 and the following steps S404–S413. These steps S403–S413 are identical with steps S201–S211, with some exceptions. Namely, the motor 264 is controlled in step S411 so that the photosensitive sheet 234 and the developer sheet 252 are fed at the feed rate of 35 mm/sec. stored in the FEED RATE memory 315. Further, the flags which are reset in step S413 do not include the GLOSSINESS DETECT flag 322 which is not provided in this embodiment.

In the present image transfer system, the developer sheet 252 is heated by the heater 280 at a temperature between 120° C. and 100° C., while being fed at the rate of 35 mm/sec. These operating parameters are determined so as to give a comparatively high glossiness to the heated developer sheet 252.

In the case where the glossiness selector switch 301 is placed in the OFF position, a negative decision (NO) is obtained in step S401, and step S414 is implemented. In this case, the developer sheet 252 is heated at a temperature between 80° C. and 100° C., while being fed at a rate of 240 mm/sec. Thus, the heating of the developer sheet 252 occurs at a comparatively low temperature for a comparatively short time, whereby the glossiness level given to the developer sheet 252 is lower than that obtained where the selector switch 301 is placed in the ON position.

While the above embodiment is adapted to select one of the two glossiness levels, it is possible that the desired glossiness level of the developer sheet 252 be selected from three or more different values. In this case, the glossiness level may be changed in steps or continuously.

Although both the heating temperature and the feed rate of the developer sheet 252 are controlled in the above embodiment, only one of these two parameters may be controlled to change the glossiness level. For example, the developer sheet 252 is heated selectively at a temperature of 100°–120° C. in a first mode, or at a temperature of 80°–100° C. in a second mode, but the feed rate in both modes is 35 mm/sec. The glossiness level obtained in the first mode is comparatively high, and that in the second mode is comparatively low.

While the present invention has been described in its presently preferred embodiments, it is to be understood that the invention is not confined to the precise details of the illustrated embodiments, and to the illustrated modifications, but the invention may be embodied with various other changes, modifications and improvements which may occur to those skilled in the art, without departing from the spirit and scope of the invention defined in the following claims.

What is claimed is:

1. A recording system for forming images on a recording sheet, comprising:
   an exposing device for image-wise exposing a pressure-sensitive photosensitive sheet to radiation, so as to form thereon latent images, according to source image information;
   a developing device for applying pressure to the image-wise exposed photosensitive sheet, for causing a chemical reaction to thereby develop said latent images into visible images on a recording sheet;

a feeding device for feeding said recording sheet; and a heating device for heating said recording sheet for promotion said chemical reaction to thereby increase a density of said visible images, said heating device having an inlet portion and an outlet portion which are disposed such that said recording sheet is fed in a direction from said inlet portion toward said outlet portion, said heating device being operated such that said inlet portion has a heating temperature lower than that of said outlet portion.

2. A recording system according to claim 1, wherein said heating device has a heating surface for facial contact with said recording sheet, said heating surface having a lower temperature at said inlet portion, than at said outlet portion.

3. A recording system according to claim 2, wherein said outlet portion comprises a primary heating member having a heat-generating source, while said inlet portion comprises an auxiliary heating member, and said heating device further comprises a heat-conductive member which is operable between a first position in which said heat-conductive member is operable to conduct heat from said primary heating member to said auxiliary heating member, and a second position in which said heat-conductive member is inoperable, said heating device further comprising actuator means for normally placing said heat-conductive member in said first position while a temperature of said actuator means is lower than a predetermined temperature lower than a temperature of said primary heating member, and for moving said heat-conductive member to said second position when the temperature of said actuator means rises to said predetermined temperature, whereby a temperature of said auxiliary heating member is kept at a temperature in the neighborhood of said predetermined temperature.

4. A recording system according to claim 3, wherein said actuator means comprises a temperature-sensitive member connected to said heat-conductive member and a stationary member.

5. A recording system according to claim 3, wherein said actuator means comprises a solenoid which is mechanically connected to said heat-conductive member and is electrically connected to a temperature sensor for detecting a temperature of said auxiliary heating member.

6. A recording system according to claim 1, wherein said pressure-sensitive photosensitive sheet and said recording sheet consist of a self-activated type photosensitive sheet which comprises a substrate, and a layer of microcapsules and a developer layer which are supported by said substrate, each of said microcapsules comprises a light-sensitive base resin, and a chromogenic material which is held by said base resin and capable of reacting with a developing material of said developer layer.

7. A recording system according to claim 1, wherein said recording sheet consists of a developer sheet which has a developing material, while said pressure-sensitive photosensitive sheet comprises a layer of microcapsules each of which has a light-sensitive base resin, and a chromogenic material which is held by said base resin and capable of reacting with said developing material.

8. A recording system according to claim 1 wherein said heating device comprises a plurality of heating rolls having rotating axes which are perpendicular to the feeding direction of said recording sheet and which are spaced apart from each other in said feeding direction, said heating rolls having temperatures which increase in said feeding direction from said inlet portion toward said outlet portion.

9. A recording system according to claim 1, wherein said source image information is provided on an original having an image-bearing surface, and said exposing device comprises an image-illuminating device operable to produce said radiation, and thereby illuminate said image-bearing surface of the original, said recording system further comprising:

a feeding device for feeding said recording sheet;

a detector for sensing a glossiness level of said image-bearing surface of said original; and a control device responsive to said detector, and operable for controlling at least one of a heating temperature of said heating device and a rate of feeding of said recording sheet by said feeding device, so as to give said recording sheet a glossiness corresponding to said glossiness level sensed by said detector.

10. A recording system according to claim 1, further comprising a feeding device for feeding said recording sheet, and a control device operable to control at least one of a heating temperature of said heating device and a rate of feeding of said recording sheet by said feeding device, such that a glossiness of said recording sheet coincides with a selected one of a plurality of different levels.

11. A recording system for forming images on a recording sheet, comprising:

an exposing device for image-wise exposing a pressure-sensitive photosensitive sheet to a radiation, so as to form thereon latent images, according to source image information provided on an original which has an image-bearing surface;

a developing device for causing a chemical reaction to develop said latent images on said photosensitive sheet into visible images on a recording sheet;

a feeding device for feeding said recording sheet;

a detector for sensing a glossiness level of said image-bearing surface of said original;

a heating device for heating the developed recording sheet for promoting said chemical reaction to thereby increase a density of said visible images; and a control device responsive to said detector, and operable for controlling at least one of a heating temperature of said heating device and a rate of feeding of said recording sheet by said feeding device, so as to give said recording sheet a glossiness corresponding to said glossiness level sensed by said detector.

12. A recording system according to claim 11, wherein said heating device has a heating surface for facial contact with said recording sheet.

13. A recording system for forming images on a recording sheet, comprising:

an exposing device for image-wise exposing a pressure-sensitive photosensitive sheet to a radiation, so as to form thereon latent images, according to source image information;

a developing device for causing a chemical reaction to develop said latent images on said photosensitive sheet into visible images on a recording sheet;

a feeding device for feeding said recording sheet;

a heating device for heating said recording sheet for promoting said chemical reaction to thereby increase a density of said visible images; and a control device operable to control at least one of a heating temperature of said heating device and a rate of feeding of said recording sheet by said feeding device, such that a glossiness of said recording sheet coincides with a selected one of a plurality of different levels.

14. A recording system according to claim 13, further comprising a glossiness selector for selecting one of said plurality of different levels of the glossiness of said developed recording sheet.

15. A recording system according to claim 13, wherein said heating device has a heating surface for facial contact with said recording sheet.

16. A recording system for forming images on a recording sheet, comprising:

an exposing device for image-wise exposing a pressure-sensitive photosensitive sheet to a radiation, so as to form thereon latent images, according to source image information;

a developing device for causing a chemical reaction to develop said latent images on said photosensitive sheet into visible images on a recording sheet;

a feeding device for feeding said recording sheet;

a heating device for heating said recording sheet for promoting said chemical reaction to thereby increase a density of said visible images;

said heating device including a heat-generating source having a cylindrical wall, and a non-metallic heat-conductive endless belt in direct contact with said cylindrical wall for conducting heat generating by said source to said recording sheet, said cylindrical wall and said endless belt being rotated in the same direction and at the same rate as said recording sheet while said recording sheet is moved by said feeding device;

a temperature sensor disposed on one of opposite sides of said non-metallic layer which is nearer to said heat-generating source; and a control circuit connected to said temperature sensor and said heat-generating source, for controlling said heat-generating source to regulate an amount of heat generated by said heat-generating source, according to an output signal provided by said temperature sensor.

17. A recording system according to claim 16, further comprising a driven roll which is in rolling contact with said endless belt, said cylindrical wall of said heat-generating source functioning as a driving roll to rotate said endless belt such that said recording sheet is passed through a nip between said endless belt and said driven roll.

18. A recording system according to claim 11, wherein said heating device comprises a pair of presser members operable to press said recording sheet therebetween, one of said presser members having a smooth surface for contact with an image-bearing surface of said recording sheet, whereby said image-bearing surface of the recording sheet is smoothed and glossed by pressed contact with said smooth surface of said one presser member.

19. A recording system according to claim 18, wherein said one of said presser members includes a heating member.

20. A recording system according to claim 8, wherein the other of said pair of presser members has a surface for contact with a surface of said recording sheet opposite to said image-bearing surface, said other presser member including a heating member.

21. A recording system according to claim 11, wherein said heating device includes a heat-generating source, and a heat-conductive member for conducting heat generated by said source to said recording sheet, said heat-conductive member including a non-metallic layer, said image transfer system further comprising:

a temperature sensor disposed on one of opposite sides of said non-metallic layer which is nearer to said heat-generating source; and a control circuit connected to said temperature sensor and said heat-generating source, for controlling said heat-generating source to regulate an amount of heat generated by said source, according to an output signal provided by said temperature sensor.

22. A recording system according to claim 21, further comprising a feeding device for feeding said recording sheet, and wherein said non-metallic layer of said heat-conductive member comprises a belt of a synthetic resin which is moved in the same direction and at the same rate as said recording sheet when the recording sheet is moved by said feeding device.

* * * * *